(12) United States Patent
Chung et al.

(10) Patent No.: US 11,626,499 B2
(45) Date of Patent: Apr. 11, 2023

(54) SEMICONDUCTOR DEVICE

(71) Applicant: SAMSUNG ELECTRONICS CO., LTD., Suwon-si (KR)

(72) Inventors: Wonkeun Chung, Seoul (KR);
Heonbok Lee, Suwon-si (KR);
Chunghwan Shin, Hwaseong-si (KR);
Youngsuk Chai, Seoul (KR); Sangjin Hyun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/524,259

(22) Filed: Nov. 11, 2021

(65) Prior Publication Data
US 2022/0077295 A1    Mar. 10, 2022

Related U.S. Application Data

(63) Continuation of application No. 16/998,493, filed on Aug. 20, 2020, now Pat. No. 11,195,927, which is a continuation of application No. 16/203,197, filed on Nov. 28, 2018, now Pat. No. 10,763,335.

(30) Foreign Application Priority Data

Jun. 25, 2018  (KR) .......................... 10-2018-0072891

(51) Int. Cl.
| | |
|---|---|
| H01L 29/08 | (2006.01) |
| H01L 27/092 | (2006.01) |
| H01L 29/423 | (2006.01) |
| H01L 29/78 | (2006.01) |
| H01L 29/66 | (2006.01) |

(52) U.S. Cl.
CPC ...... *H01L 29/42356* (2013.01); *H01L 27/092* (2013.01); *H01L 29/0847* (2013.01); *H01L 29/6656* (2013.01); *H01L 29/78* (2013.01)

(58) Field of Classification Search
CPC .......... H01L 29/0847; H01L 29/42356; H01L 29/6656; H01L 29/78; H01L 27/092
USPC ....................................................... 257/288
See application file for complete search history.

(56) References Cited

U.S. PATENT DOCUMENTS

| | | | |
|---|---|---|---|
| 9,685,340 B2 | 6/2017 | Ok et al. | |
| 9,721,889 B1 | 8/2017 | Niu et al. | |
| 9,735,242 B2 | 8/2017 | Xie et al. | |
| 9,825,031 B1 | 11/2017 | Bouche et al. | |
| 9,825,037 B2 * | 11/2017 | Inoue | ................ H01L 27/1255 |
| 10,453,838 B2 | 10/2019 | Jun et al. | |
| 2014/0302660 A1 | 10/2014 | Liu et al. | |

(Continued)

FOREIGN PATENT DOCUMENTS

| | | |
|---|---|---|
| JP | 05-326517 | 12/1993 |
| JP | 08-153689 | 6/1996 |

(Continued)

*Primary Examiner* — Monica D Harrison
(74) *Attorney, Agent, or Firm* — Sughrue Mion, PLLC

(57) ABSTRACT

A semiconductor device includes a substrate having an active pattern therein, a gate electrode extending across the active pattern and a source/drain region on the active pattern laterally adjacent the gate electrode. The device further includes a contact structure including a first contact on the source/drain region, a second contact on the first contact and a spacer on sidewalls of the first and second contacts.

20 Claims, 29 Drawing Sheets

(56) References Cited

U.S. PATENT DOCUMENTS

| | | |
|---|---|---|
| 2015/0028399 A1 | 1/2015 | Xiong et al. |
| 2016/0005822 A1 | 1/2016 | Song et al. |
| 2016/0181412 A1 | 6/2016 | Kwon et al. |
| 2016/0379925 A1 | 12/2016 | Ok et al. |

FOREIGN PATENT DOCUMENTS

| | | |
|---|---|---|
| KR | 10-0390038 | 7/2003 |
| KR | 10-0854898 | 8/2008 |
| KR | 10-2018-0052169 A | 5/2018 |

\* cited by examiner

SEMICONDUCTOR DEVICE

CROSS-REFERENCE TO RELATED APPLICATION

This application in a Continuation of U.S. application Ser. No. 16/998,493, filed Aug. 20, 2020, which is a Continuation of U.S. application Ser. No. 16/203,197, filed on Nov. 28, 2018, now U.S. Pat. No. 10,763,335, issued on Sep. 1, 2020, which claims priority under 35 U.S.C. § 119 to Korean Patent Application No. 10-2018-0072891, filed on Jun. 25, 2018, in the Korean Intellectual Property Office, the disclosure of which are hereby incorporated by reference in its entirety.

TECHNICAL FIELD

Example embodiments of the present disclosure relate to a semiconductor device and more specifically, to a semiconductor device including a field effect transistor and a method of manufacturing the same.

BACKGROUND

Small sized, multi-functional and/or low cost semiconductor devices are used in electronic devices. Semiconductor devices are classified into semiconductor memory devices storing logical data, semiconductor logic devices processing logical data, and hybrid semiconductor devices including memory elements and logic elements. With development of an electronics industry, there is an increasing demand for characteristics, e.g., high speed, high reliability, and/or multi-function, of semiconductor devices. To meet the demand, structures of semiconductor devices have been complicated, and semiconductor devices have become more highly integrated.

SUMMARY

According to example embodiments of the inventive concepts, a semiconductor device includes a substrate having an active pattern therein, a gate electrode extending across the active pattern, and a source/drain region on the active pattern laterally adjacent the gate electrode. The device further includes a contact structure including a first contact on the source/drain region, a second contact on the first contact and a spacer on sidewalls of the first and second contacts and having an upper surface coplanar with an upper surface of the second contact.

According to further example embodiments of the inventive concepts, a semiconductor device includes a substrate having an active pattern therein, a gate electrode extending across the active pattern, a source/drain region on the active pattern laterally adjacent the gate electrode, and a gate contact electrically connected to the gate electrode. The device further includes a contact structure electrically connected to the source/drain region and including a first contact on the source/drain region and a second contact on the first contact, wherein an upper surface of the second contact is coplanar with an upper surface of the gate contact and wherein an upper surface of the first contact is lower than a lower surface of the gate contact.

According to still further example embodiments of the inventive concepts, a semiconductor device includes a substrate having an active pattern therein, a gate electrode longitudinally extending across the active pattern along a first direction, and a source/drain region on the active pattern laterally adjacent the gate electrode. The device further includes a contact structure including a first contact on the source/drain region, a second contact on the first contact and having a maximum width less than a maximum width of the first contact along the first direction. An insulation layer is disposed on a sidewall of the first contact.

DETAILED DESCRIPTION

Figure 1:
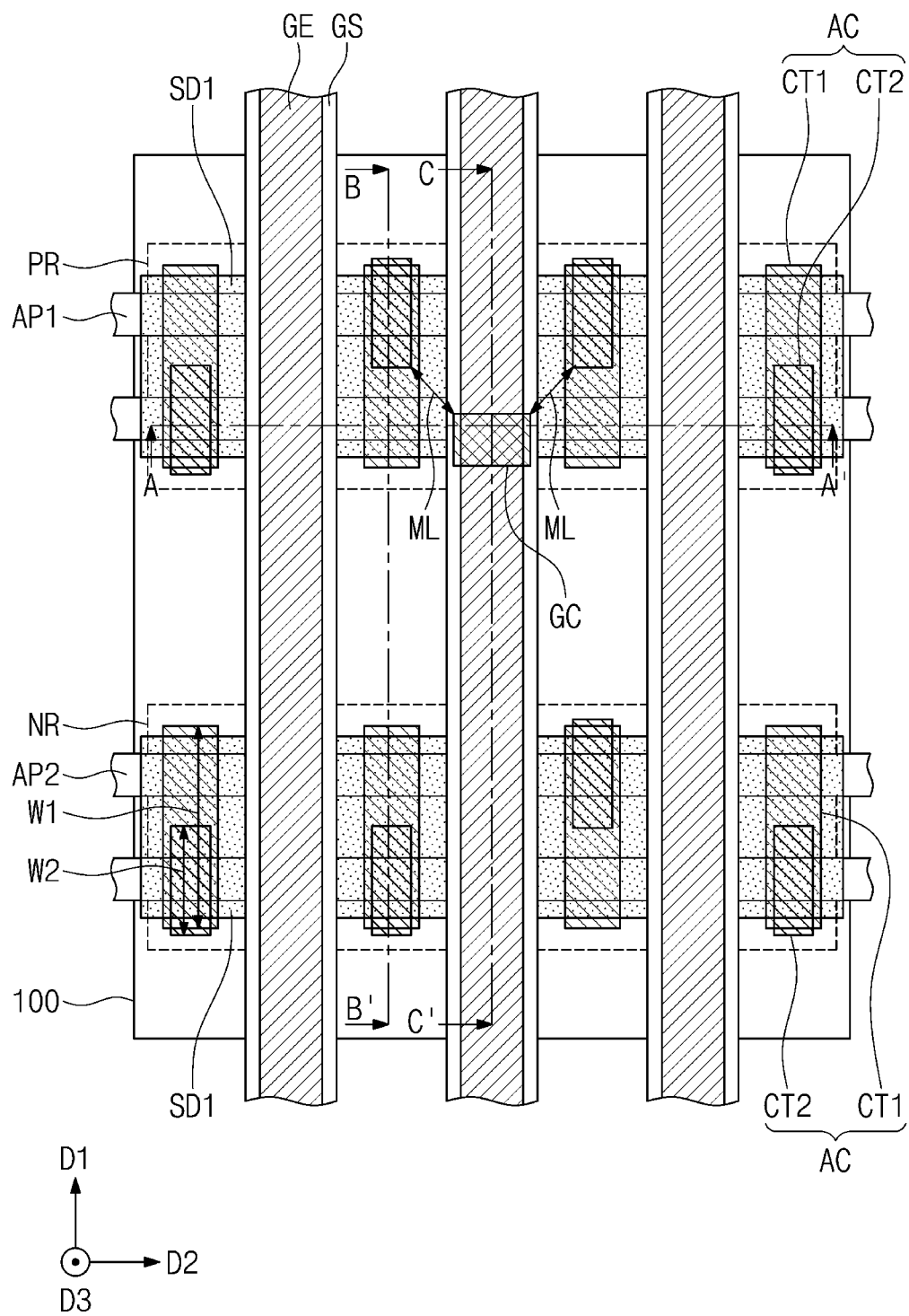
FIG. 1 is a plan view illustrating a semiconductor device according to example embodiments.

Various example embodiments will now be described more fully hereinafter with reference to the accompanying drawings. Like reference numerals may refer to like elements throughout this application.

Figure 2A:
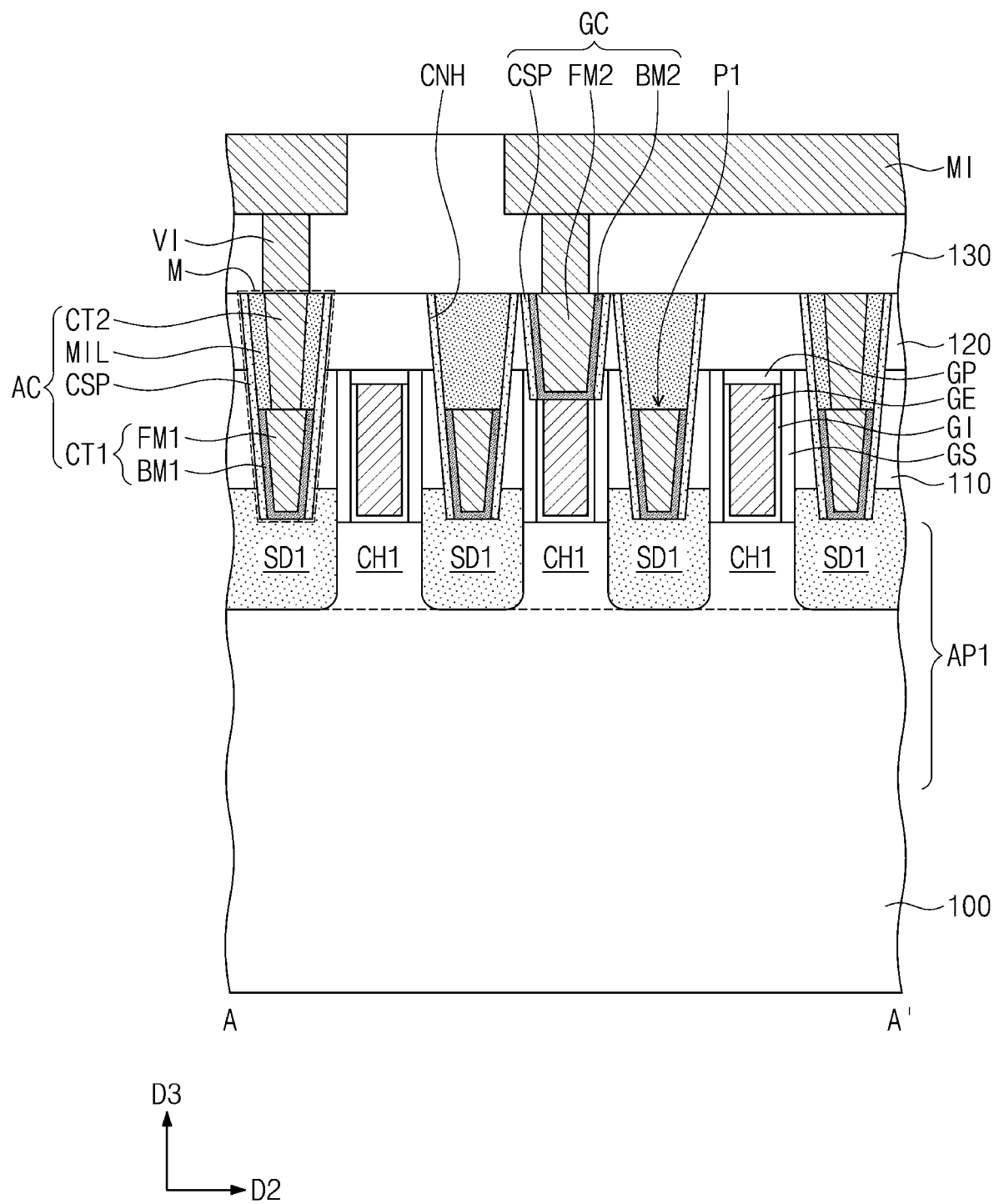
FIGS. 2A, 2B, and 2C are cross-sectional views taken along lines A-A', B-B', and C-C', respectively, of FIG. 1.
Figure 2B:
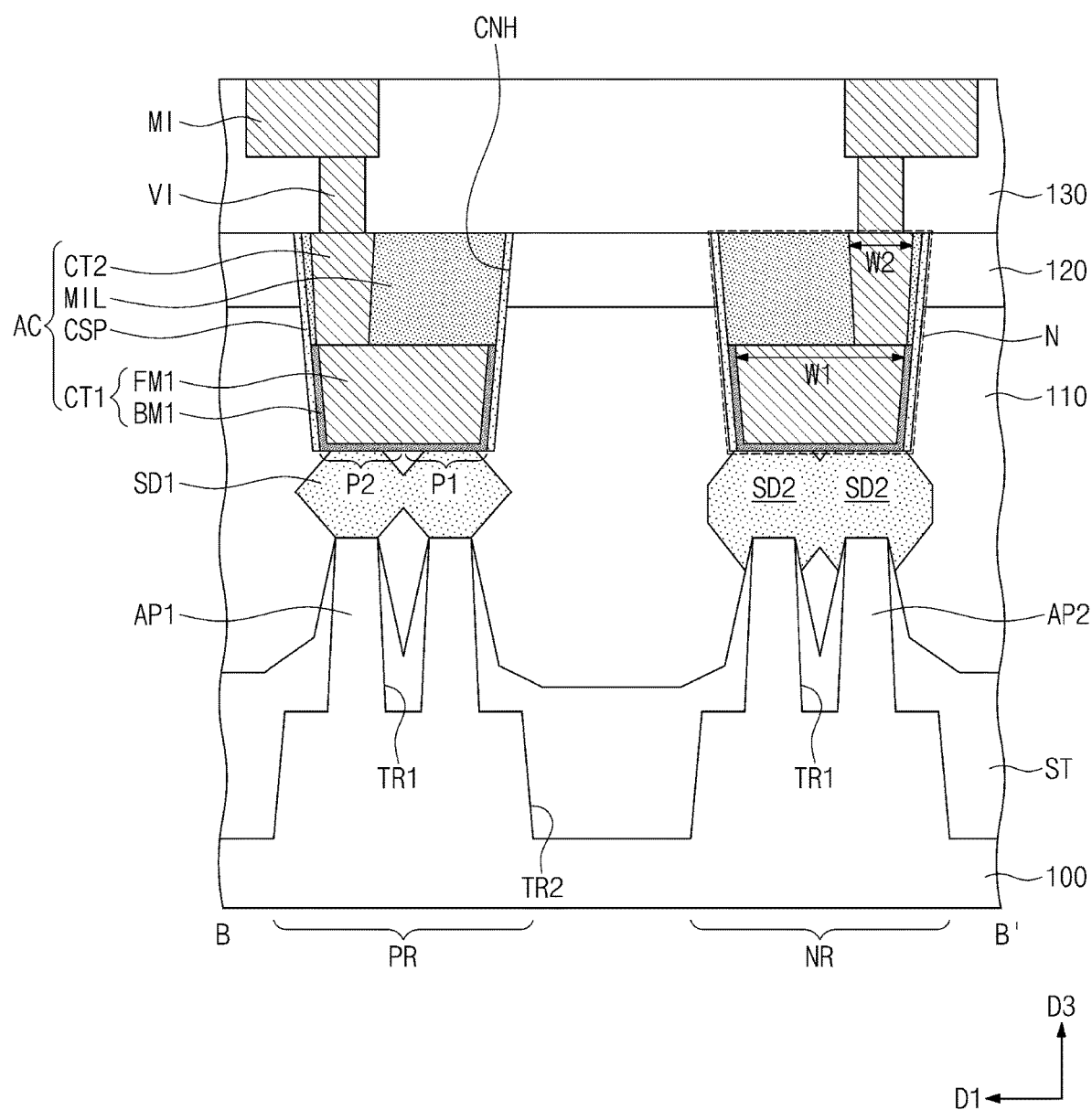
Figure 2C:
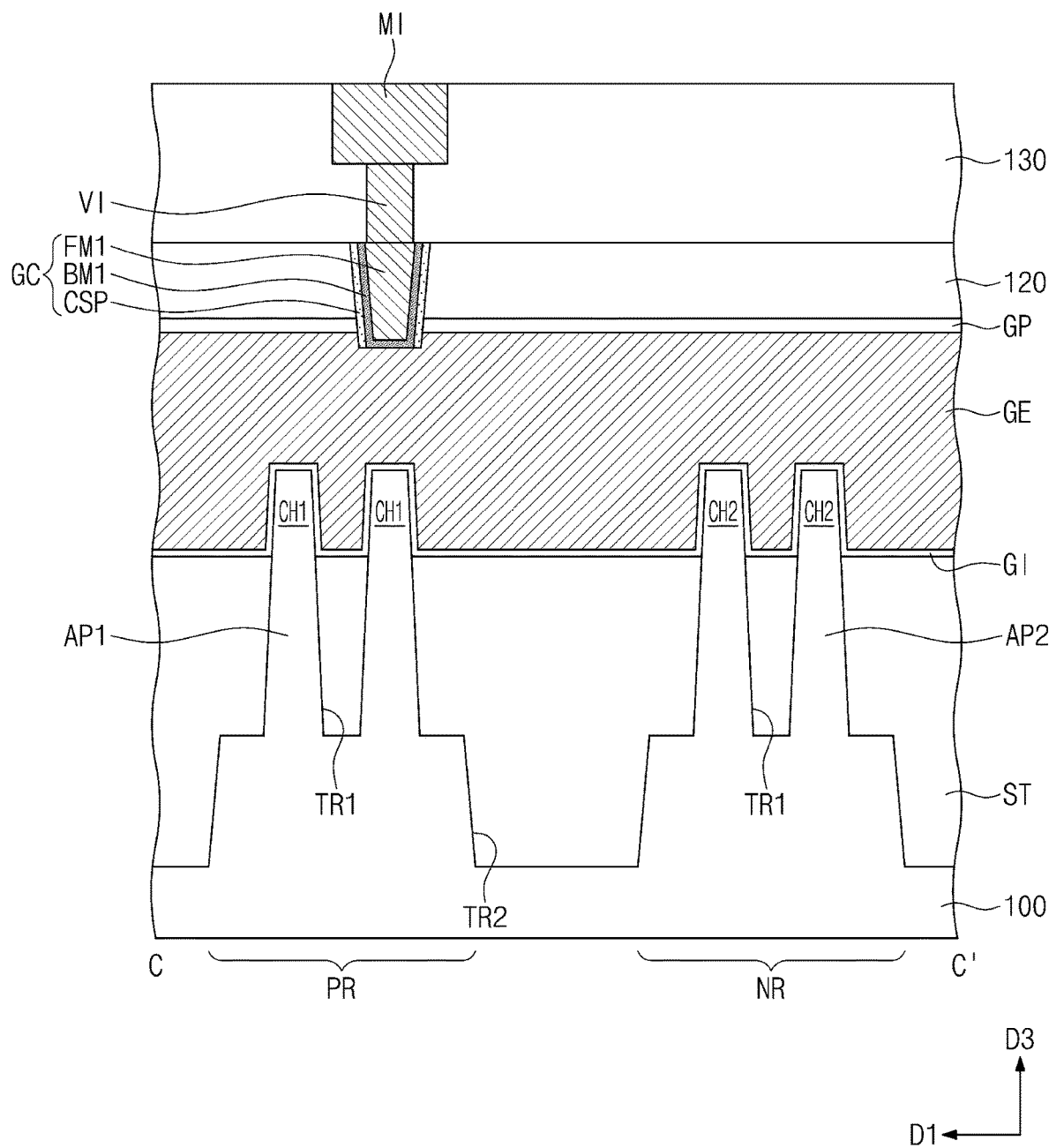

FIG. 1 is a plan view illustrating a semiconductor device according to example embodiments. FIGS. 2A, 2B, and 2C are cross-sectional views taken along lines A-A', B-B', and C-C', respectively, of FIG. 1.

FIGS. 1 and 2A to 2C, a substrate 100 may include a PMOSFET region PR and an NMOSFET region NR. The substrate 100 may be a semiconductor substrate including silicon, germanium, or etc. or a compound semiconductor substrate. As an example, the substrate 100 may be a silicon substrate.

In some embodiments, the PMOFET region PR and the NMOSFET region NR may be a logic cell region in which logic transistors constituting logic circuits of a semiconductor device are disposed. For example, the logic transistors constituting a process core or an input/output (I/O) terminal may be disposed on the substrate 100 of the logic cell region. The PMOSFET region PR and the NMOSFET region NR may include some of the logic transistors.

The PMOSFET region PR and the NMOSFET region NR may be defined by a second trench TR2 formed in an upper portion of the substrate 100. The second trench TR2 may be disposed between the PMOSFET region PR and the NMOSFET region NR. The PMOSFET region PR and the NMOSFET region NR may be spaced apart from each other in a first direction D1 with the second trench TR2 therebetween. Each of the PMOSFET region PR and the NMOSFET region NR may extend in a second direction D2 crossing the first direction D1. The first direction D1 and the second direction D2 may be parallel to an upper surface of the substrate 100.

A plurality of active patterns AP1 and AP2 may be disposed on the PMOSFET region PR and the NMOSFET region NR and may extend in the second direction D2. The active patterns AP1 and AP2 may include first active patterns AP1 on the PMOSFET region PR and second active patterns AP2 on the NMOSFET region NR. The first and second active patterns AP1 and AP2 may be portions, e.g., vertically protruding portions, of the substrate 100. A first trench TR1 may be defined between adjacent first active patterns AP1 and between adjacent second active patterns AP2.

A device isolation layer ST may fill the first and second trenches TR1 and TR2. The device isolation layer ST may include an insulating material, e.g., silicon oxide. Upper portions of the first and second active patterns AP1 and AP2 may vertically protrude above the device isolation layer ST. Each of the upper portions of the first and second active patterns AP1 and AP2 may have a fin shape. The device isolation layer ST may not cover the upper portions of the first and second active patterns AP1 and AP2. The device isolation layer ST may cover lower sidewalls of the first and second active patterns AP1 and AP2.

First source/drain regions SD1 may be disposed on the first active patterns AP1. Each of the first source/drain regions SD1 may include a first conductivity type (e.g., a p-type) impurity region. A first channel region CH1 may be interposed between a pair of first source/drain regions SD1. Second source/drain regions SD2 may be disposed on the second active patterns AP2. Each of the second source/drain regions SD2 may include a second conductivity type (e.g., an n-type) impurity region. A second channel region CH2 may be interposed between a pair of second source/drain regions SD2.

The first and second source/drain regions SD1 and SD2 may be epitaxial patterns formed by a selective epitaxial growth process. Upper surfaces of the first and second source/drain regions SD1 and SD2 may be positioned at a higher level than upper surfaces of the first and second channel regions CH1 and CH2. In some embodiments, the first source/drain regions SD1 may include a semiconductor element (e.g., SiGe) having a larger lattice constant than that of a semiconductor element of the substrate 100. Thus, the first source/drain regions SD1 may apply a compressive stress to the first channel region CH1. In some embodiments, the second source/drain regions SD2 may include the same element (e.g., Si) as the substrate 100.

Gate electrodes GE may be disposed to traverse the first and second active patterns AP1 and AP2 and may extend in the first direction D1. The gate electrodes GE may be spaced apart from each other. The gate electrodes GE may vertically overlap the first and second channel regions CH1 and CH2. Referring to FIG. 2C, each of the gate electrodes GE may cover the upper surface and sidewalls of each of the first and second channel regions CH1 and CH2. The gate electrodes GE may include a conductive metal nitride, e.g., titanium nitride or tantalum nitride, and/or metal, e.g., titanium, tantalum, tungsten, copper, or aluminum.

A pair of gate spacers GS may be disposed on opposite sidewalls of each of the gate electrodes GE. The gate spacers GS may extend in the first direction D1 along the gate electrodes GE. Upper surfaces of the gate spacers GS may be higher than upper surfaces of the gate electrodes GE, with respect to the upper surface of the substrate 100. The upper surfaces of the gate spacers GS may be coplanar with an upper surface of a first interlayer insulation layer 110 to be described later. The gate spacers GS may include at least one of SiCN, SiCON, and SiN. In some embodiments, each of the gate spacers GS may include a multi-layer film formed of at least two of SiCN, SiCON, and SiN Gate dielectric patterns GI may be interposed between the gate electrodes GE and the first and second active patterns AP1 and AP2. Each of the gate dielectric patterns GI may extend along a lower surface of each of the gate electrodes GE. Each of the gate dielectric patterns GI may cover the upper surface and the sidewalls of each of the first and second channel regions CH1 and CH2. The gate dielectric patterns GI may include a high-k dielectric material. For example, the high-k dielectric material may include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

Gate capping patterns GP may be disposed on the gate electrodes GE, respectively. The gate capping patterns GP may extend in the first direction D1 along the gate electrodes GE. The gate capping patterns GP may include a material having an etch selectivity with respect to the first interlayer insulation layer 110 and a second interlayer insulation layer 120 to be described later. The gate capping patterns GP may include at least one of SiON, SiCN, SiCON, and SiN.

The first interlayer insulation layer 110 may be disposed on the substrate 100. The first interlayer insulation layer 110 may cover the gate spacers GS and the first and second source/drain regions SD1 and SD2. The upper surface of the first interlayer insulation layer 110 may be substantially coplanar with upper surfaces of the gate capping patterns GP. The second interlayer insulation layer 120 may be disposed on the first interlayer insulation layer 110 to cover the gate capping patterns GP. The first and second interlayer insulation layers 110 and 120 may include, e.g., silicon oxide.

Contact structures AC may be disposed to pass through the first and second interlayer insulation layers 110 and 120 and to be electrically connected to the first and second source/drain regions SD1 and SD2. Specifically, a contact hole CNH may be defined to pass through the first and second interlayer insulation layers 110 and 120 to expose the first source/drain region SD1 and/or the second source/drain region SD2. Each of the contact structures AC may be disposed in the contact hole CNH. Each of the contact structures AC may be disposed between a pair of gate electrodes GE.

Each of the contact structures AC may include a first contact CT1, a second contact CT2 on the first contact CT1, a contact spacer CSP, and an insulation layer MIL. The contact spacer CSP may conformally cover an inner sidewall of the contact hole CNH.

The first contact CT1 may be disposed in a lower portion of the contact hole CNH. The first contact CT1 may include a first barrier pattern BM1 and a first conductive pattern FM1. The first barrier pattern BM1 may be interposed between the first conductive pattern FM1 and the contact spacer CSP and between the first conductive pattern FM1 and each of the first and second source/drain regions SD1 and SD2. The first barrier pattern BM1 may cover sidewalls and a lower surface of the first conductive pattern FM1. The first barrier pattern BM1 may not cover an upper surface of the first conductive pattern FM1. As an example, an upper surface of the first barrier pattern BM1 may be coplanar with the upper surface of the first conductive pattern FM1. An upper surface of the first contact CT1 may be lower than the upper surface of each of the gate electrodes GE, with respect to the upper surface of the substrate 100.

The second contact CT2 and the insulation layer MIL may be disposed in an upper portion of the contact hole CNH. The insulation layer MIL may be interposed between the second contact CT2 and the contact spacer CSP. The second contact ST2 may contact the upper surface of the first contact CT1. A lower surface of the second contact CT2 may be lower than the upper surface of each of the gate electrodes GE, with respect to the upper surface of the substrate 100. An upper surface of the second contact ST2 may be coplanar with an upper surface of the contact spacer CSP, an upper surface of the insulation layer MIL, and an upper surface of the second interlayer insulation layer 120.

The first barrier pattern BM1 may include metal nitride, e.g., at least one of titanium nitride, tungsten nitride, and tantalum nitride. The first conductive pattern FM1 may include metal, e.g., at least one of aluminum, copper, tungsten, molybdenum, and cobalt. The second contact CT2 may include metal, e.g., at least one of aluminum, copper, tungsten, molybdenum, and cobalt. As an example, the second contact CT2 may include metal different from the first conductive pattern FM1. The first conductive pattern FM1 may include tungsten, and the second contact CT2 may include cobalt. The contact spacer CSP may include at least one of SiCN, SiCON, and SiN. The insulation layer MIL may include silicon oxide or silicon nitride.

Referring again to FIG. 2B, a maximum width of the first contact CT1 in the first direction D1 may be a first width W1, and a maximum width of the second contact CT2 in the first direction D1 may be a second width W2. The first width W1 may be greater than the second width W2. A width of an upper portion of the first contact CT1 in the second direction D2 may also be greater than a width of a lower portion of the second contact CT2 in the second direction D2, as shown in FIG. 2A.

The first contact CT1 may include a first portion P1 and a second portion P2 that are adjacent to each other in the first direction D1. For example, the first portion P1 may be disposed on one of a pair of first active patterns AP1, and the second portion P2 may be disposed on the other one of the pair of first active patterns AP1. The second contact CT2 may be disposed on the first portion P1 or the second portion P2. Since the first width W1 is greater than the second width W2 as described above, the second contact CT2 may be disposed on any of the first portion P1 and the second portion P2.

Referring again to FIGS. 1 and 2A to 2C, a silicide layer may be interposed between each of the first and second source/drain regions SD1 and SD2 and the first contact CT1. The contact structure AC may be electrically connected to the first source/drain region SD1 and the second source/drain regions SD2. The silicide layer may include metal silicide, e.g., at least one of titanium-silicide, tantalum-silicide, tungsten-silicide, nickel-silicide, and cobalt-silicide.

Gate contacts GC may be disposed to pass through the second interlayer insulation layer 120 and the gate capping patterns GP to be electrically connected to the gate electrodes GE. Each of the gate contacts GC may include a second barrier pattern BM2, a second conductive pattern FM2, and the contact spacer CSP. The second barrier pattern BM2 may be interposed between the second conductive pattern FM2 and the contact spacer CSP and between the second conductive pattern FM2 and each of the gate electrodes GE. The second barrier pattern BM2 may cover sidewalls and a lower surface of the second conductive pattern FM2. The second barrier pattern BM2 may not cover an upper surface of the second conductive pattern FM2.

The second barrier pattern BM2 may include metal nitride. The second conductive pattern FM2 may include metal. The contact spacer CSP of each of the gate contacts GC may include the same material as the contact spacer CSP of each of the contact structures AC.

Each of the gate contacts GC may contact the upper surface of each of the gate electrodes GE. A lower surface of each of the gate contacts GC may be higher than the upper surface of the first contact CT1 of each of the contact structures AC, with respect to the upper surface of the substrate 100. The lower surface of each of the gate contacts GC may be higher than the lower surface of the second contact CT2 of each of the contact structures AC, with respect to the upper surface of the substrate 100. Upper surfaces of the gate contacts GC may be coplanar with the upper surface of the second interlayer insulation layer 120.

As an example embodiment, at least one gate contact GC may be disposed on each of the first active patterns AP1 or each of the second active patterns AP2. The gate contact GC may be adjacent to the contact structure AC in the second direction D2. Hereinafter, a relationship between the gate contact GC and the contact structure AC adjacent thereto will be described in detail.

As an example, the first portion P1 of the first contact CT1 of the contact structure AC may be adjacent to the gate contact GC in the second direction D2. The second contact CT2 of the contact structure AC may be disposed on the second portion P2 of the first contact CT1. In other words, the second contact CT2 of the contact structure AC may be offset from the gate contact GC.

In plan view, the second contact CT2 of the contact structure AC may be spaced a minimum distance ML apart from the gate contact GC. Accordingly, an electrical short between the gate contact GC and the second contact CT2 of the contact structure AC may be prevented. If the second contact CT2 of the contact structure AC is disposed on the first portion of the first contact CT1, the gate contact GC and the second contact CT2 may be very close to each other, such that the electrical short may be generated.

In addition, as described above, the lower surface of the gate contact GC may be higher than the upper surface of the first contact CT1 of the contact structure AC, with respect to the upper surface of the substrate 100. Thus, the electrical short between the gate contact AC and the first contact CT1 of the contact structure AC may be prevented.

A third interlayer insulation layer 130 may be disposed on the second interlayer insulation layer 120. Wiring lines MI and vias VI may be disposed in the third interlayer insulation layer 130. Each of the vias VI may be interposed between each of the wiring lines MI and each of the contact structures AC and between each of the wiring lines MI and each of the gate contacts GC and may vertically connect them. The wiring lines MI and the vias VI may include metal, e.g., aluminum, copper, tungsten, molybdenum, and cobalt.

According to example embodiments, since the gate contacts GC are disposed in the PMOSFET region PR and the NMOSFET region NR, a distance between the PMOSFET region PR and the NMOSFET region NR may be reduced. As a length of the logic cell in the first direction D1 is reduced, an integration density of the semiconductor device may be increased.

The contact structure AC adjacent to the gate contact GC may include a double contact structure including the first contact CT1 and the second contact CT2. The first contact CT1 may be positioned at a lower level than the gate contact GC, with respect to the upper surface of the substrate 100. The second contact CT2 may be positioned at substantially the same level as the gate contact GC. The second contact CT2 may be offset from the gate contact GC, such that the minimum distance between the second contact CT2 and the gate contact GC may be secured. Therefore, the electrical short between the gate contact GC and the contact structure AC may be prevented, thus enhancing the reliability of the semiconductor device.

FIGS. 3, 5, 7, 9, 11 and 13 are plan views illustrating a method of manufacturing a semiconductor device according to example embodiments. FIGS. 4, 6A, 8A, 10A, 12A, and 14A are cross-sectional views taken along line A-A' of FIGS. 3, 5, 7, 9, 11, and 13, respectively. FIGS. 6B, 8B, 10B, 12B, and 14B are cross-sectional views taken along line B-B' of FIGS. 5, 7, 9, 11, and 13, respectively. FIGS. 6C, 8C, 10C, 12C, and 14C are cross-sectional views taken along line C-C' of FIGS. 5, 7, 9, 11, and 13, respectively.

Figure 3:
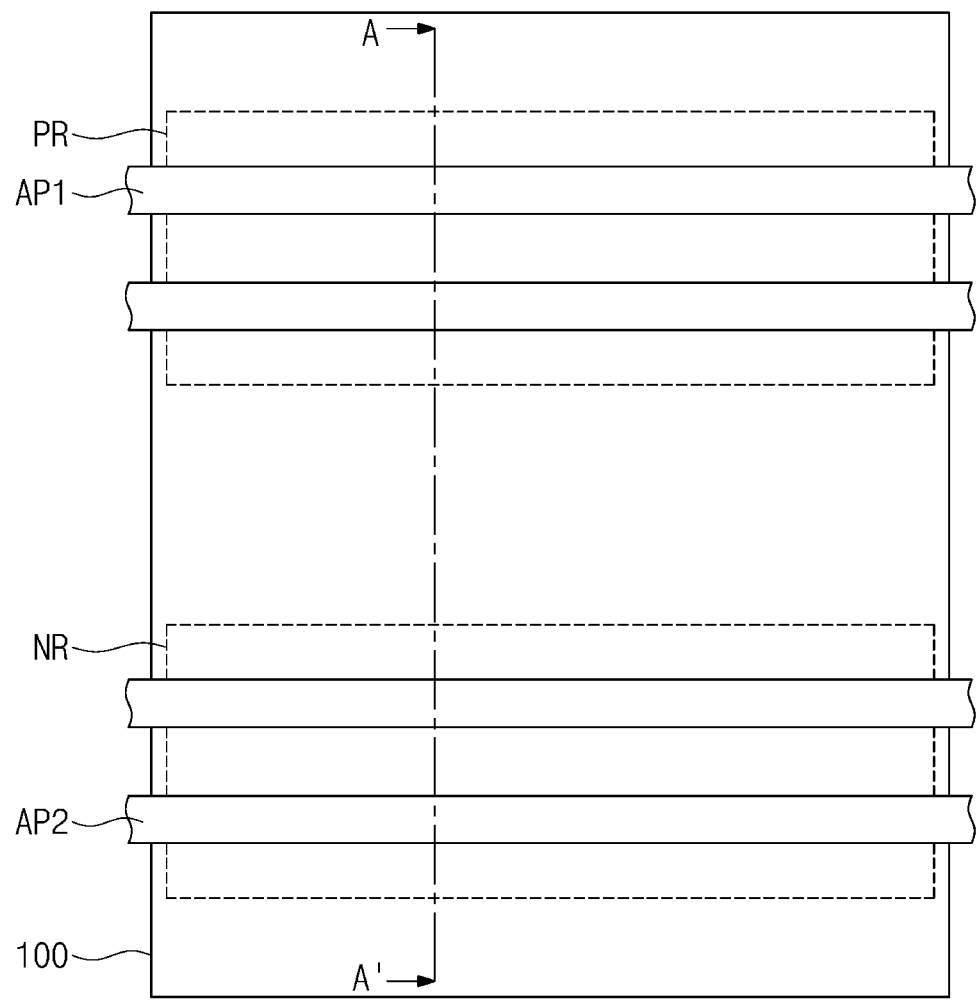
FIGS. 3, 5, 7, 9, 11 and 13 are plan views illustrating a method of manufacturing a semiconductor device according to example embodiments.
Figure 3:
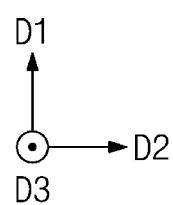
Figure 4:
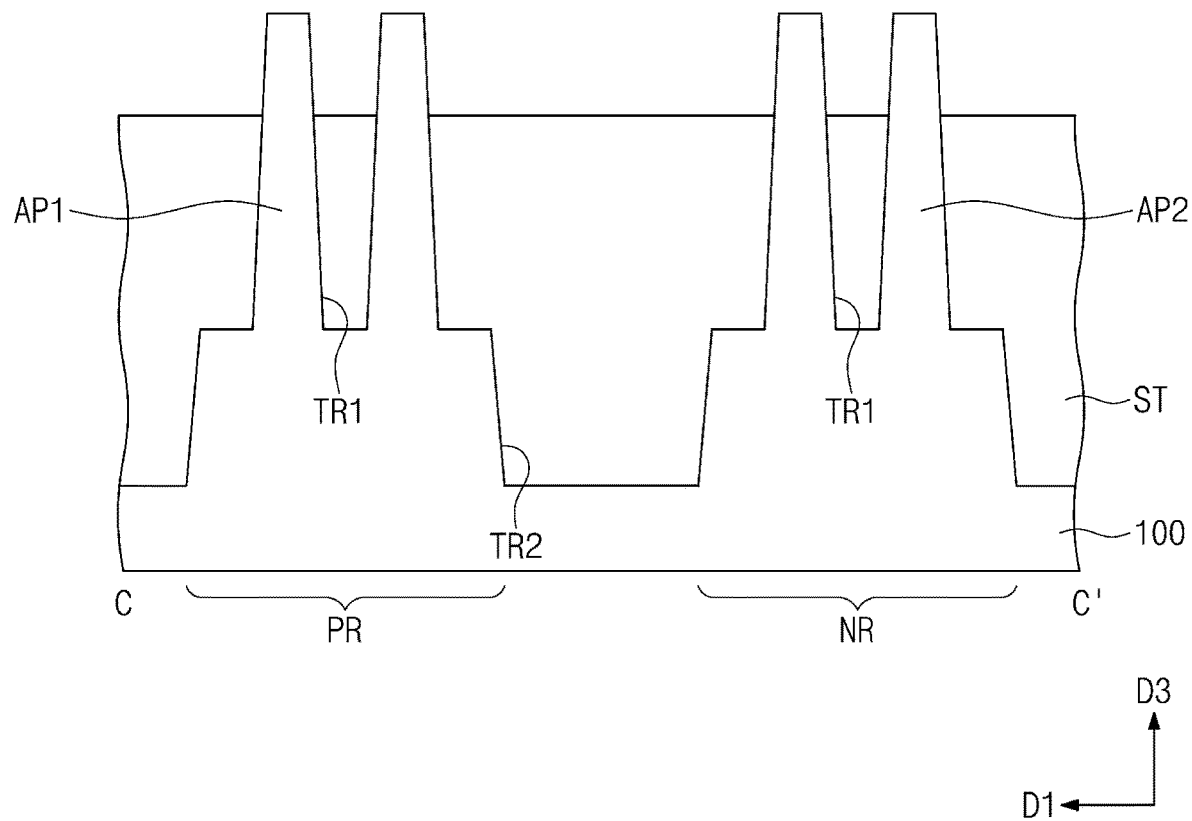
FIGS. 4, 6A, 8A, 10A, 12A, and 14A are cross-sectional views taken along line A-A' of FIGS. 3, 5, 7, 9, 11, and 13, respectively.
Figure 5:
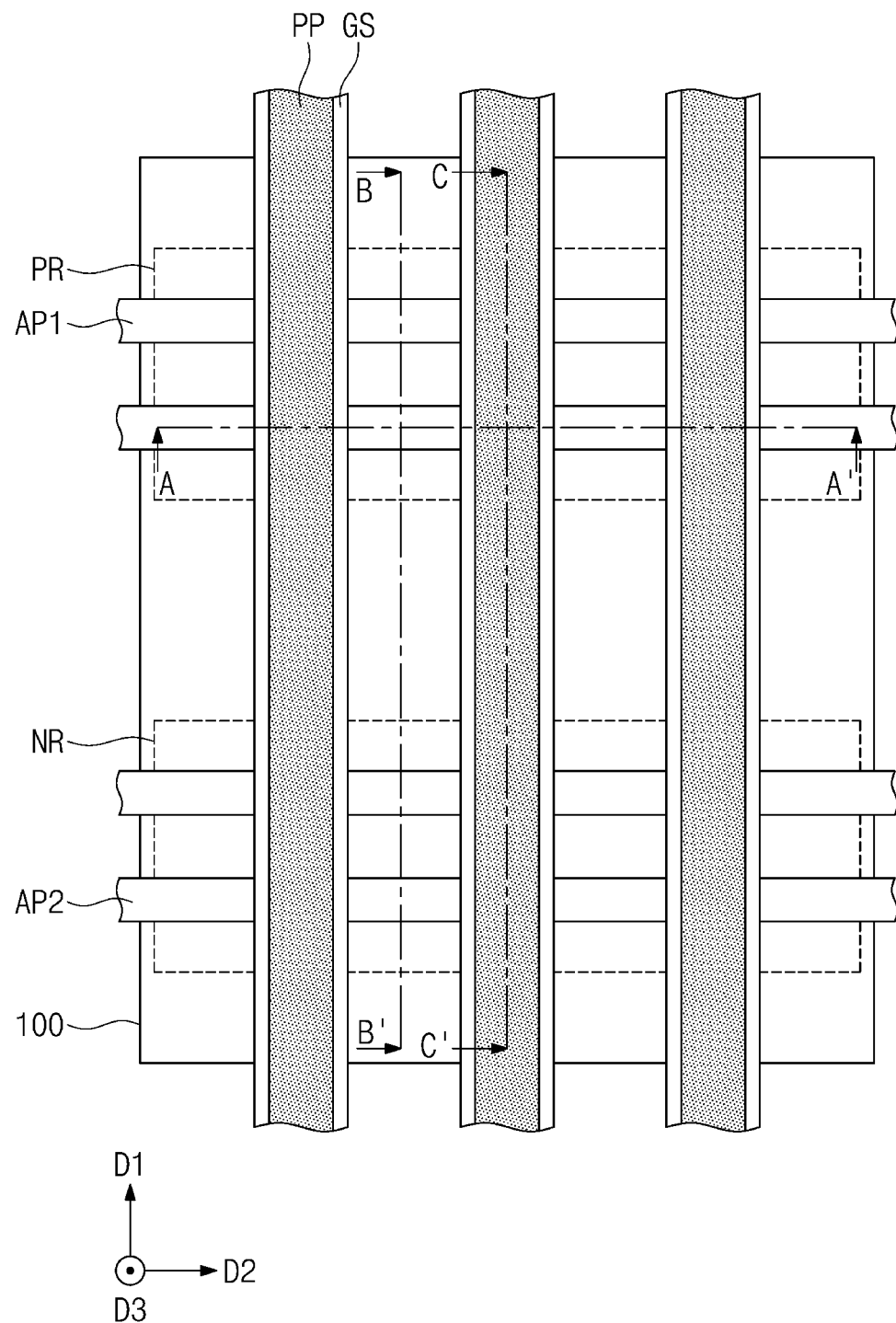
Figure 6A:
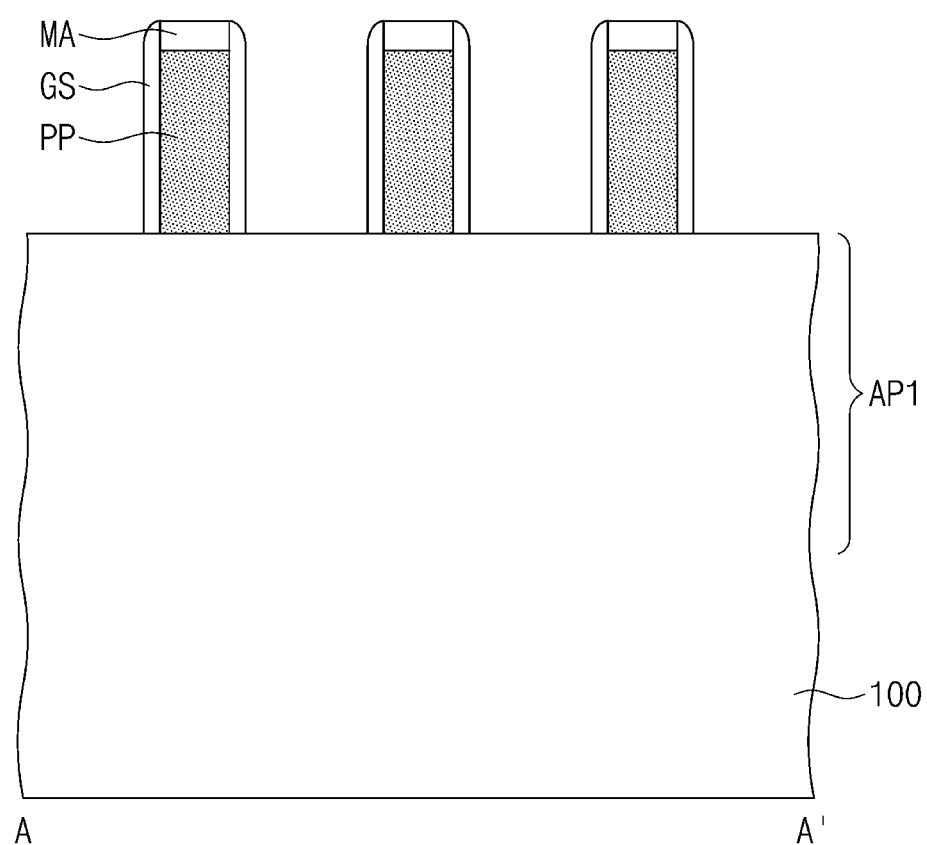
Figure 6A:
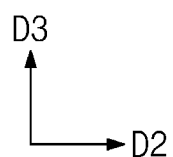
Figure 6B:
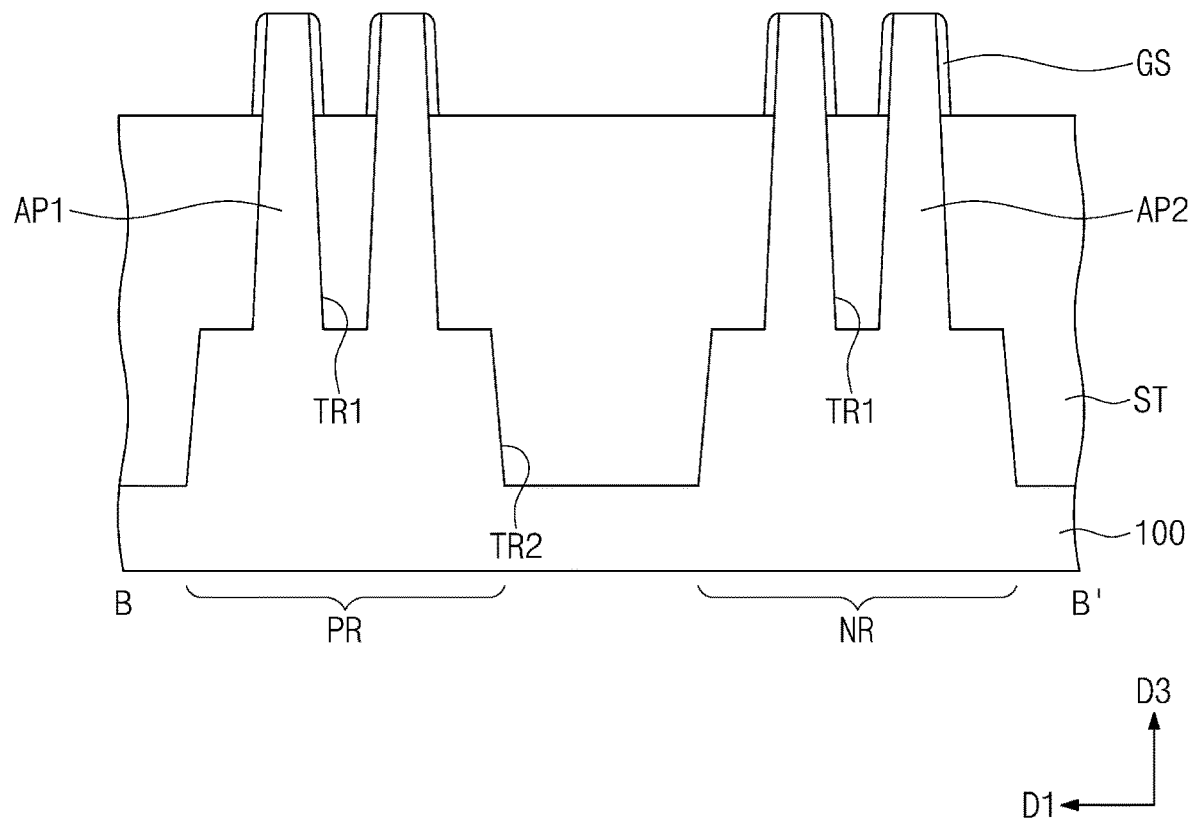
FIGS. 6B, 8B, 10B, 12B, and 14B are cross-sectional views taken along line B-B' of FIGS. 5, 7, 9, 11, and 13, respectively.
Figure 6C:
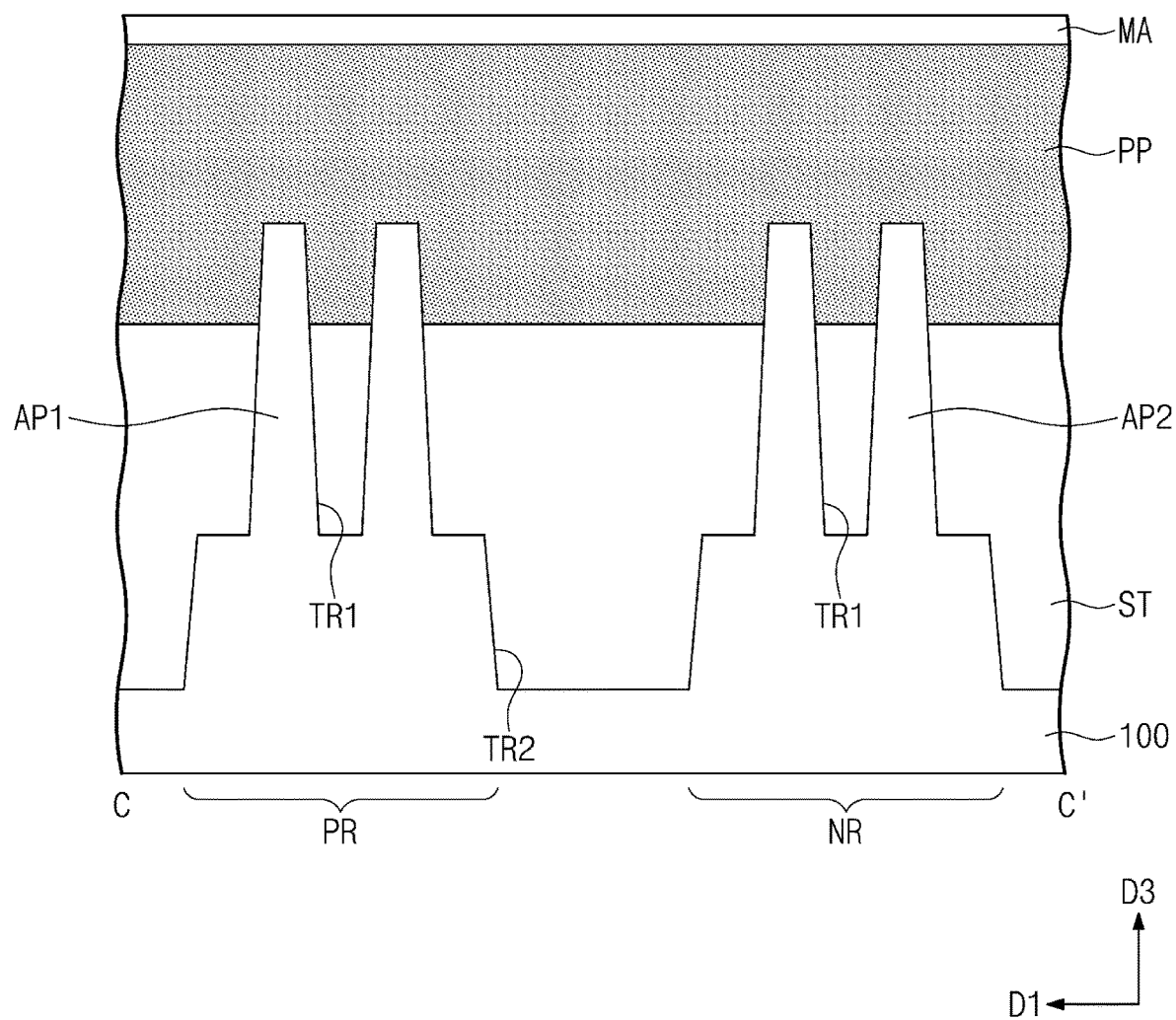
FIGS. 6C, 8C, 10C, 12C, and 14C are cross-sectional views taken along line C-C' of FIGS. 5, 7, 9, 11, and 13, respectively.
Figure 7:
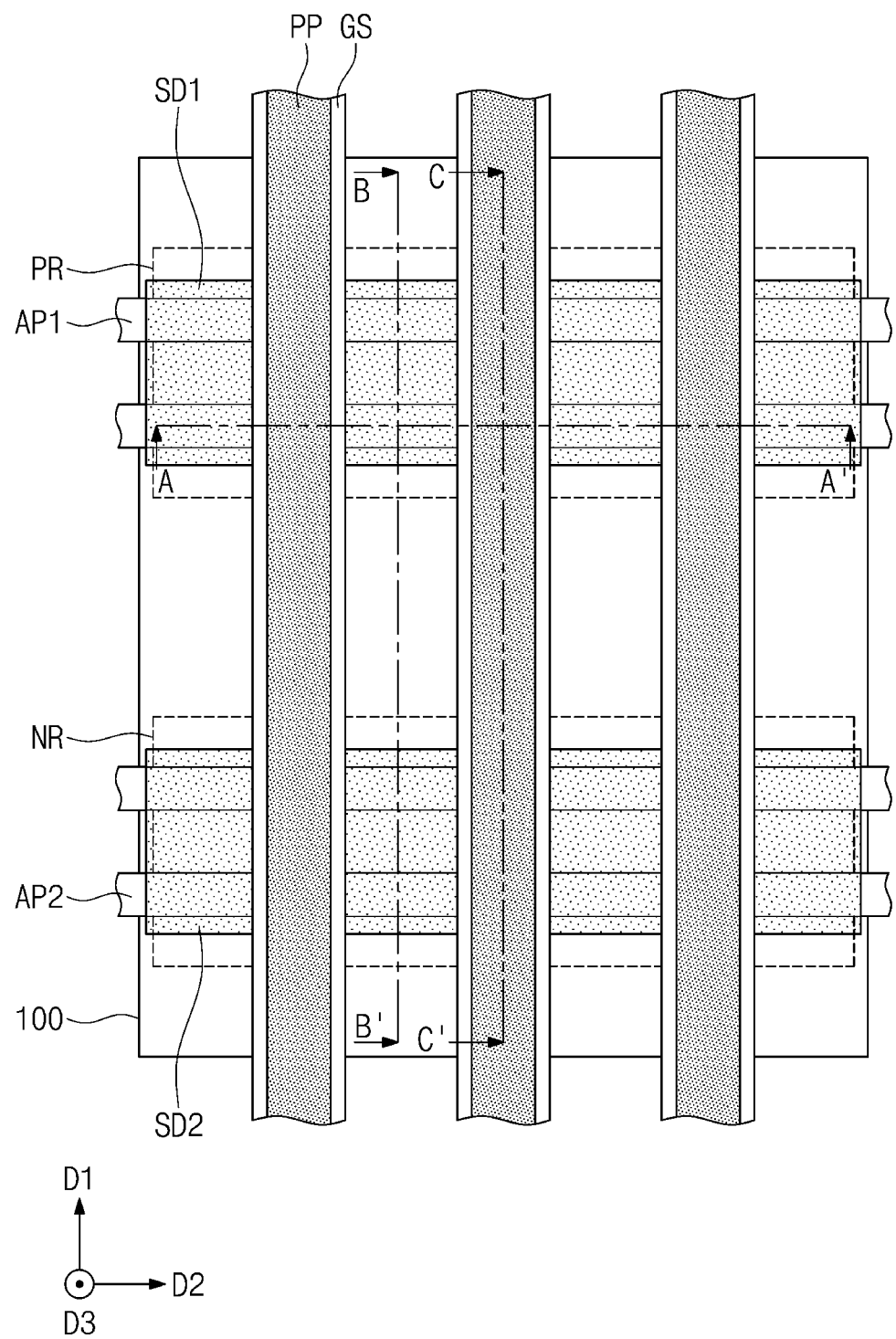
Figure 8A:
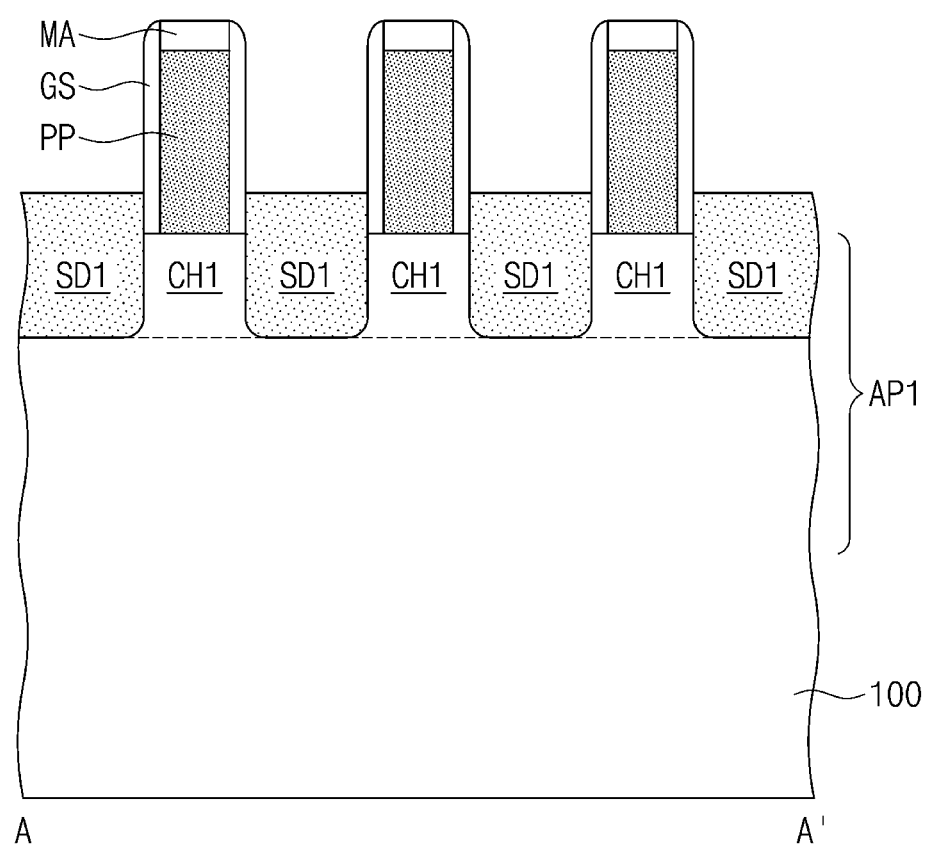
Figure 8B:
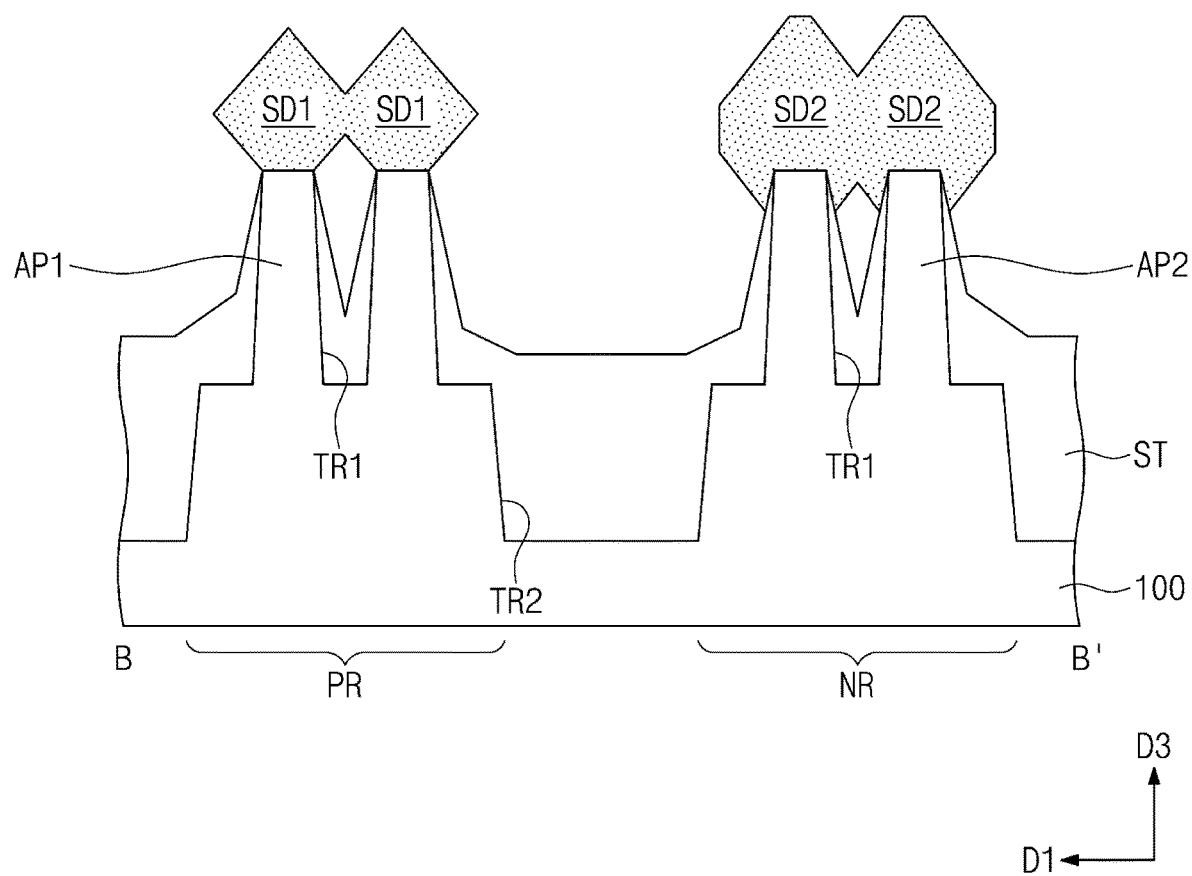
Figure 8C:
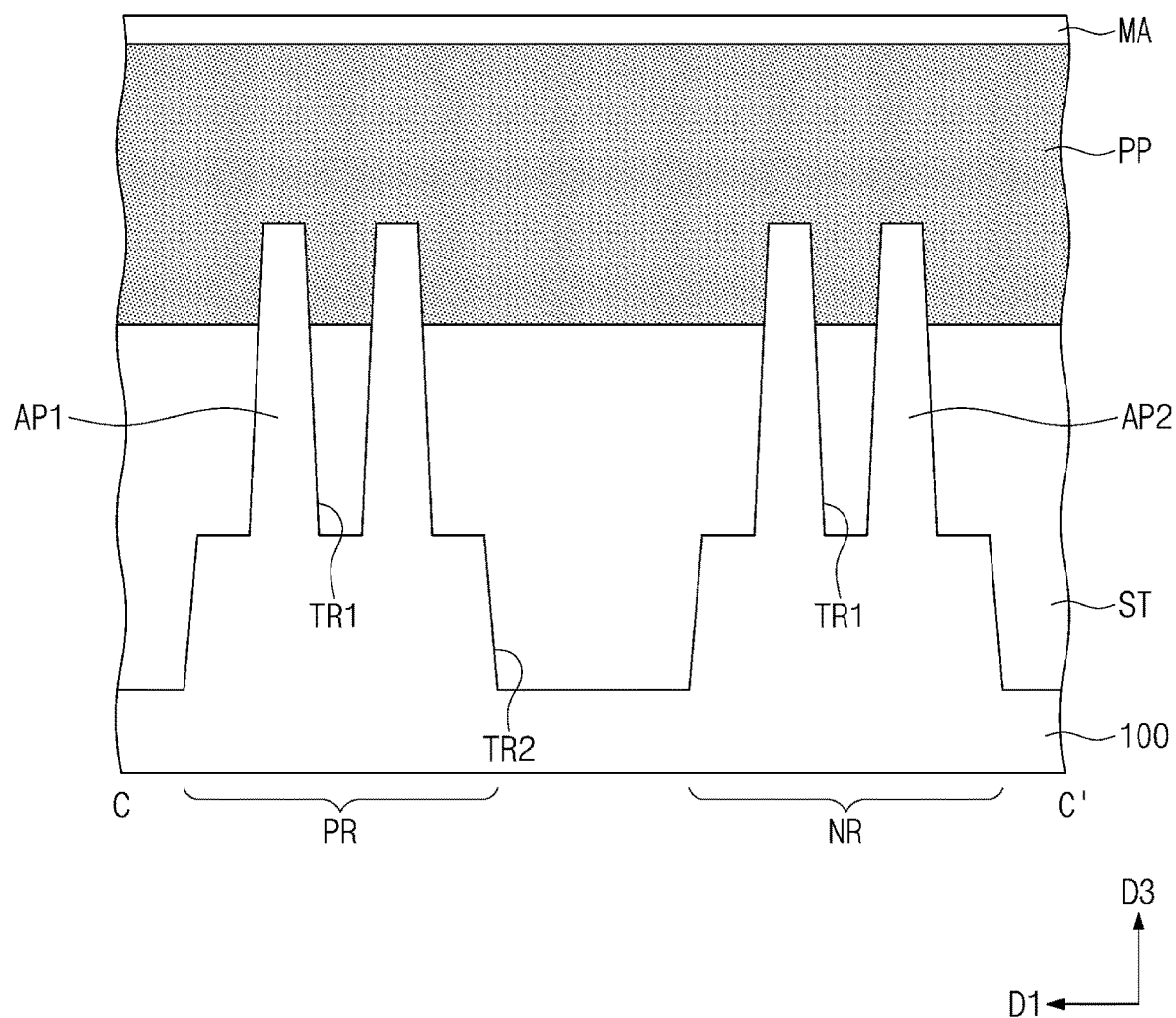
Figure 9:
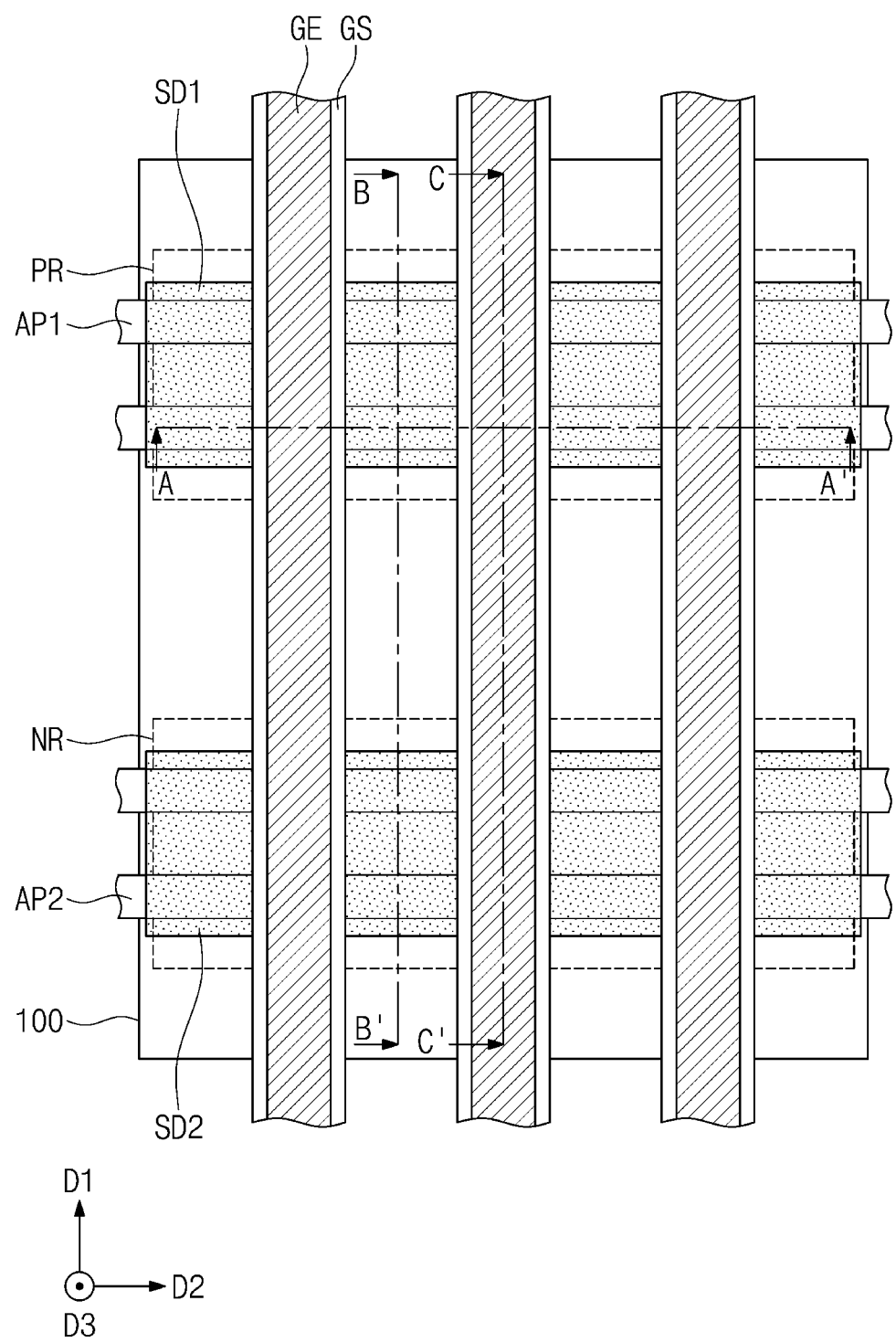
Figure 10A:
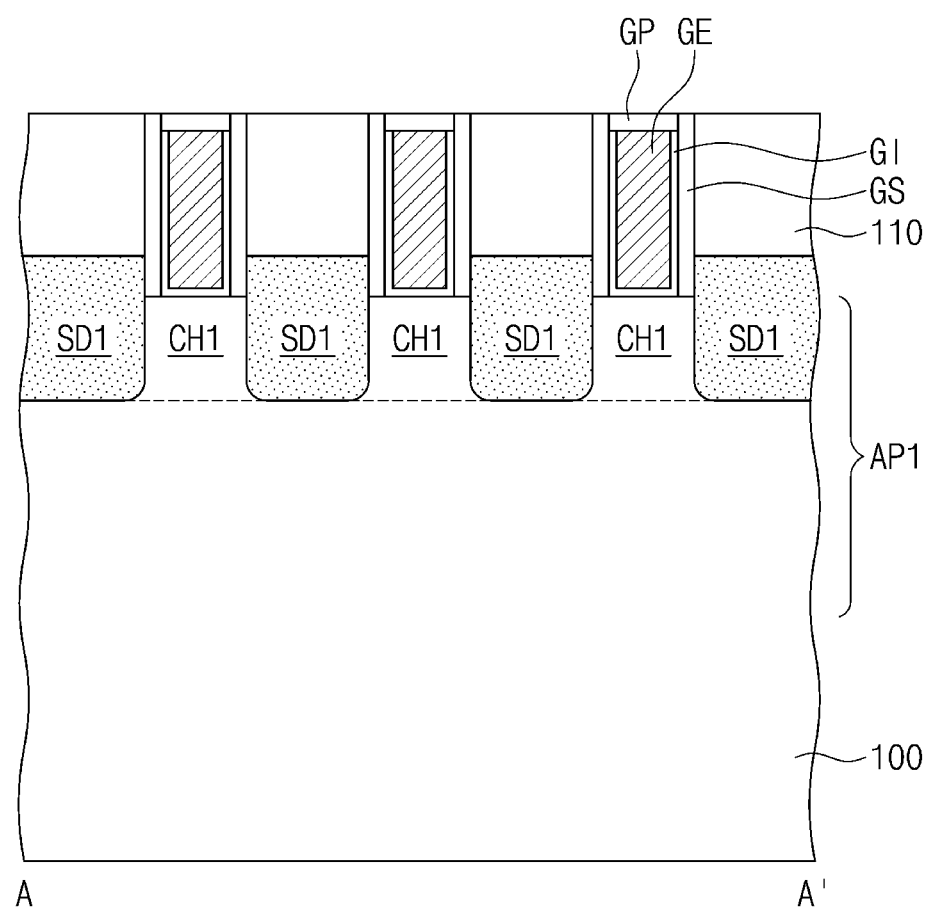
Figure 10B:
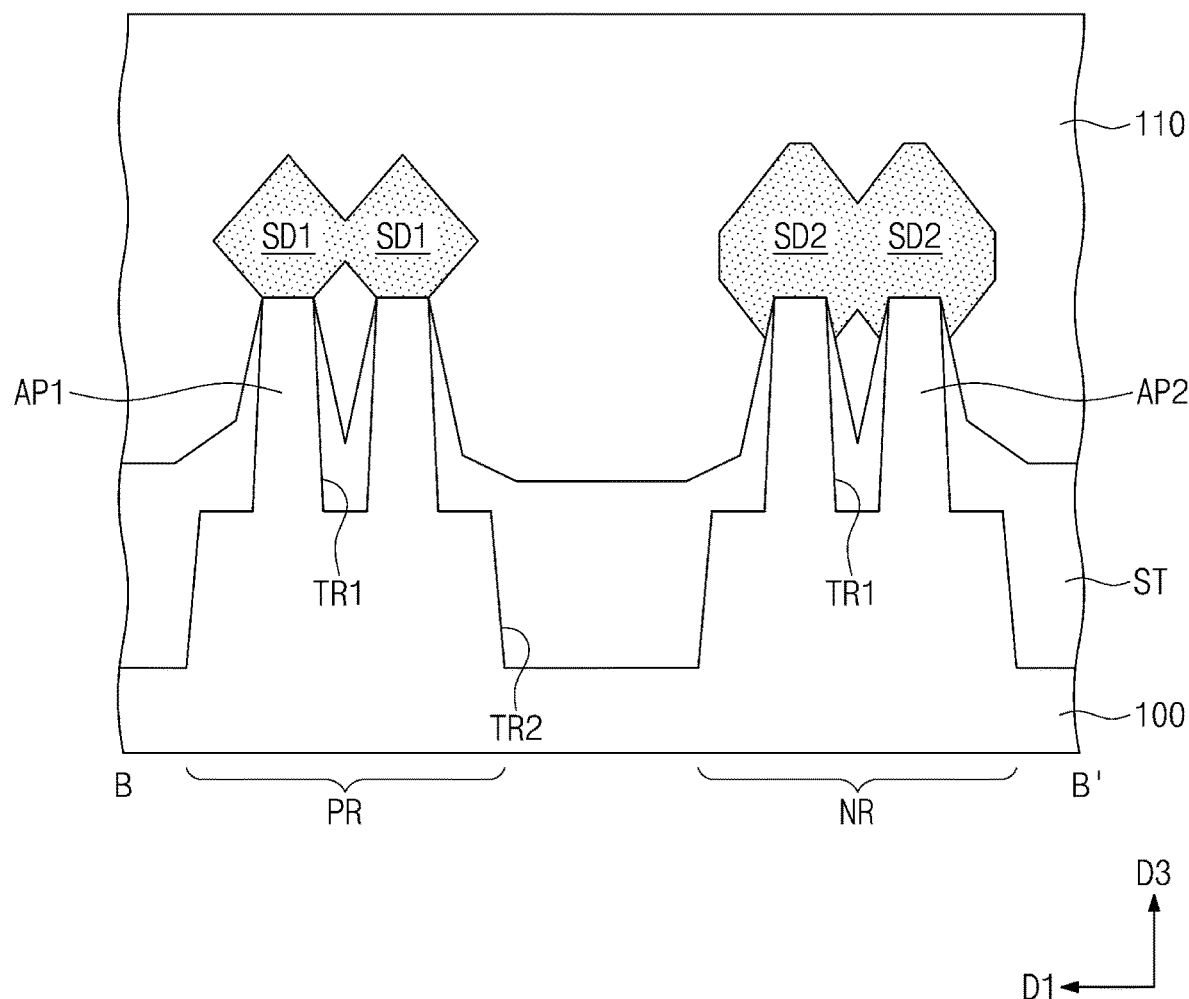
Figure 10C:
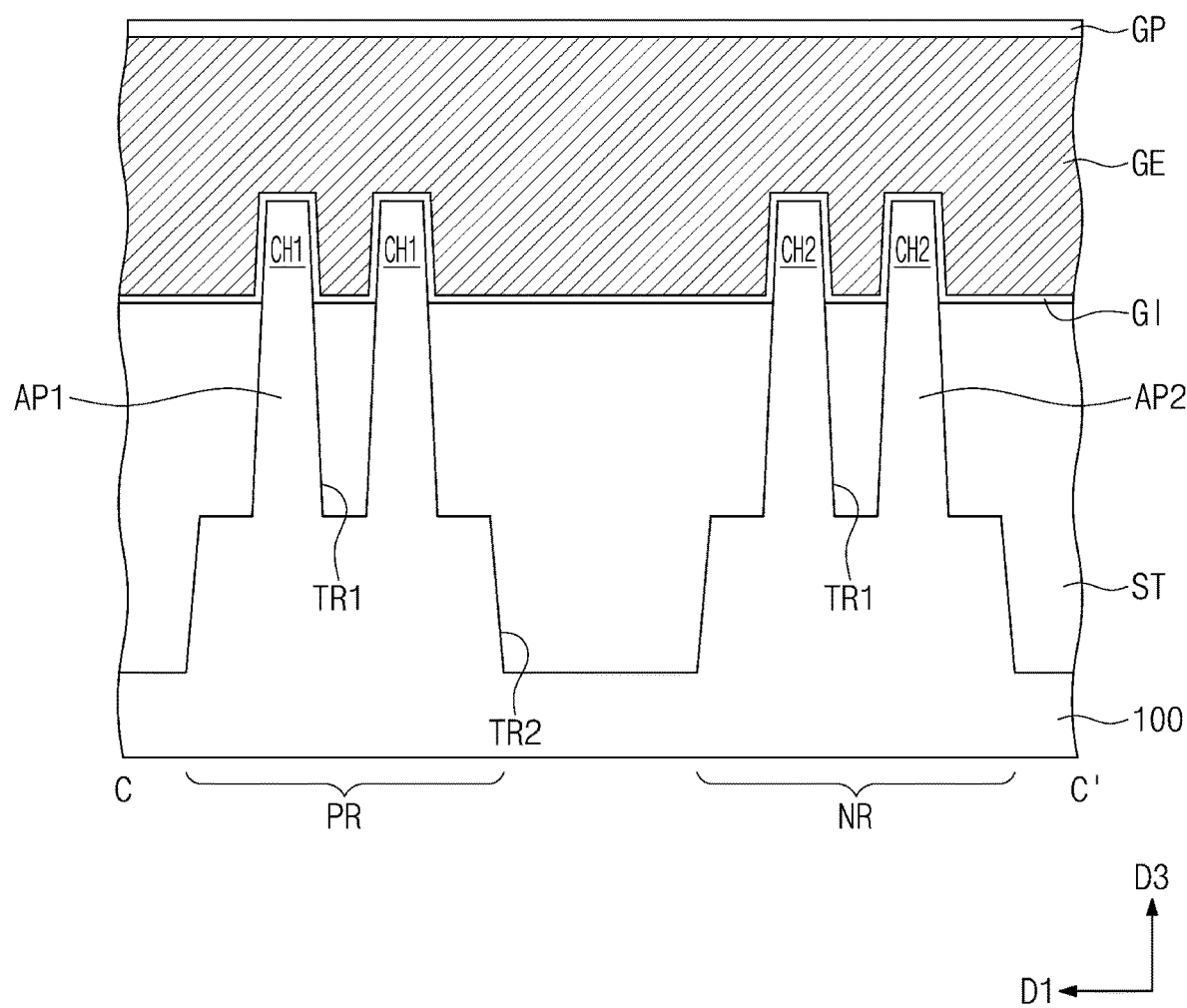
Figure 11:
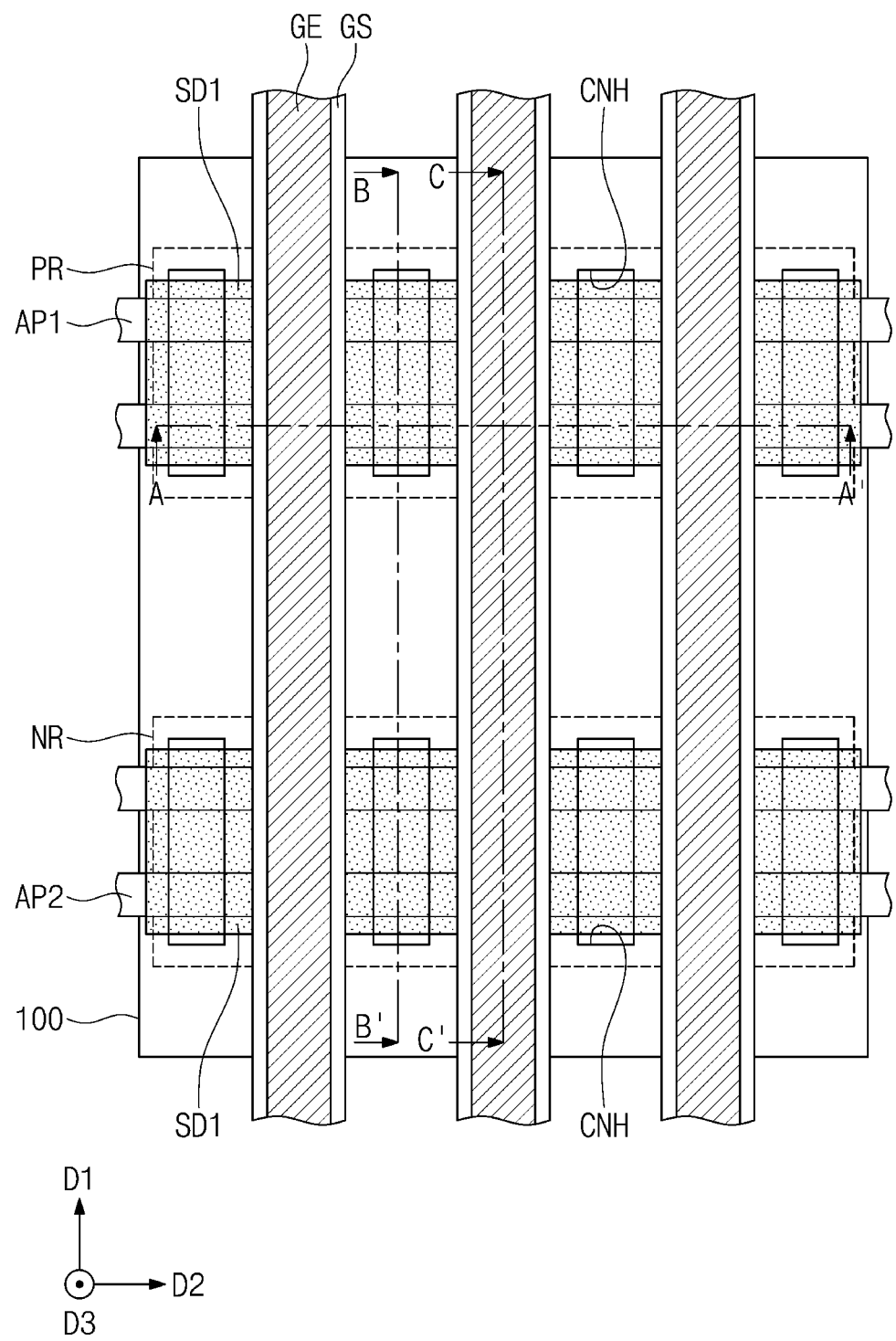
Figure 12A:
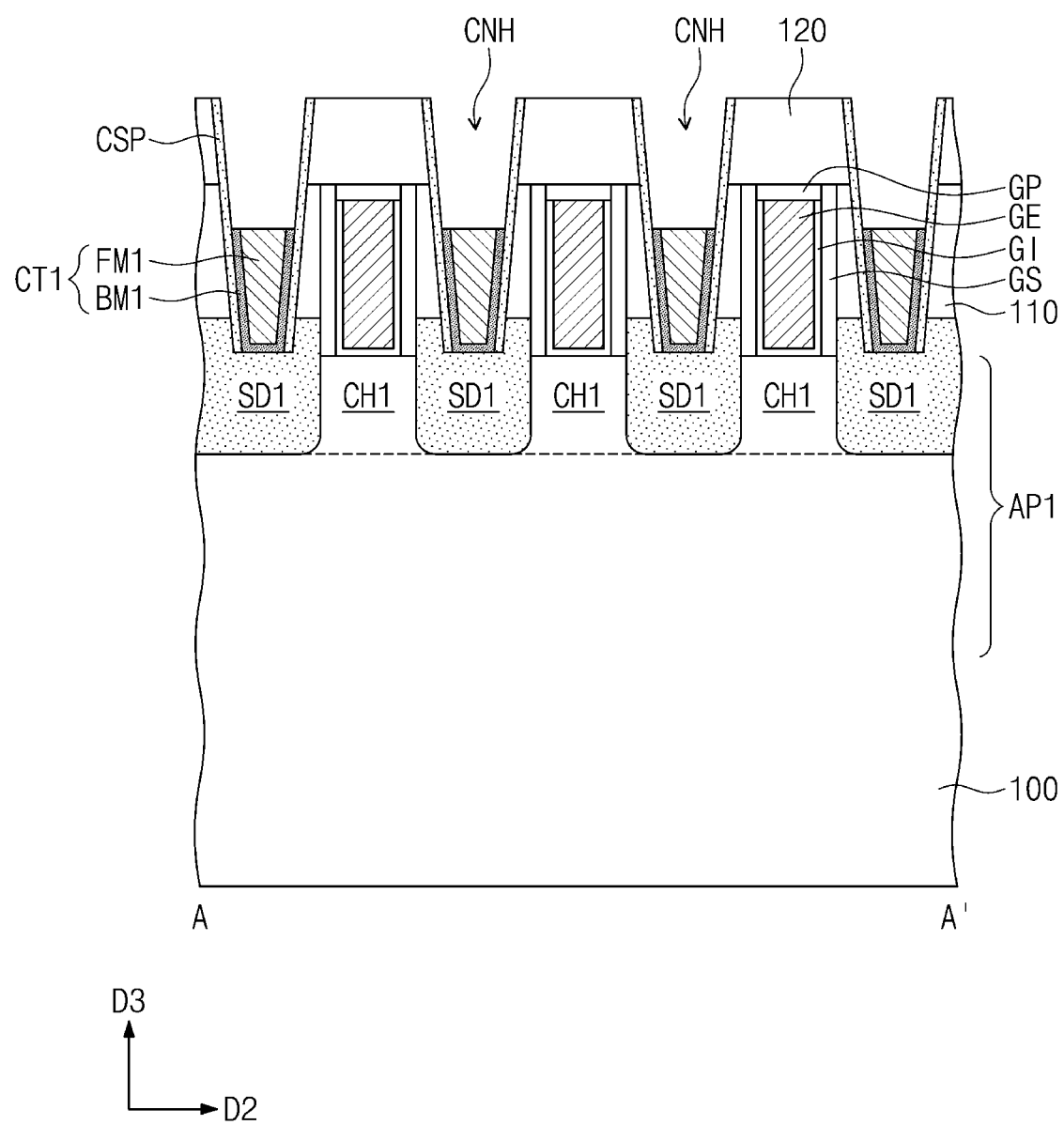
Figure 12B:
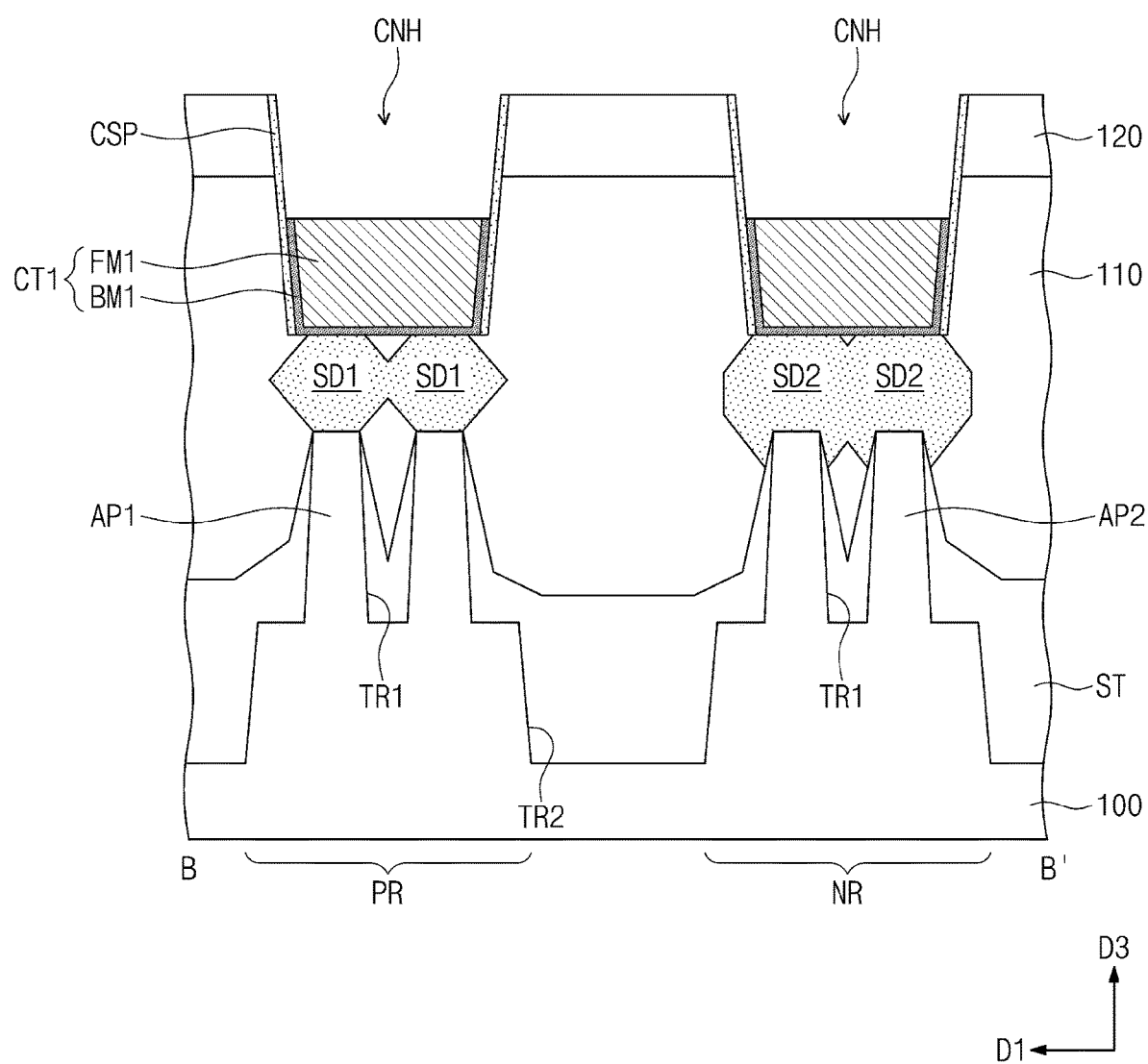
Figure 12C:
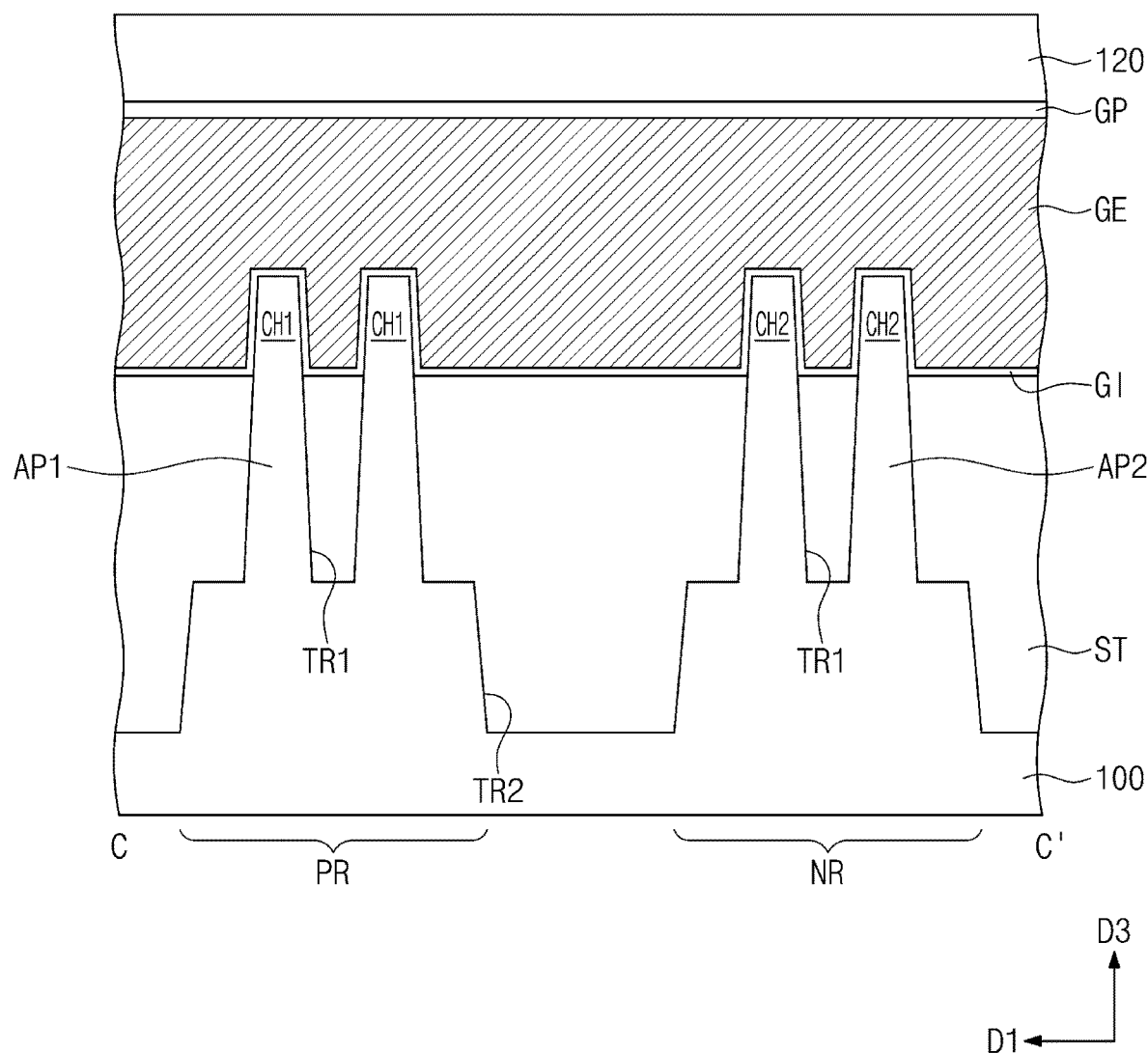
Figure 13:
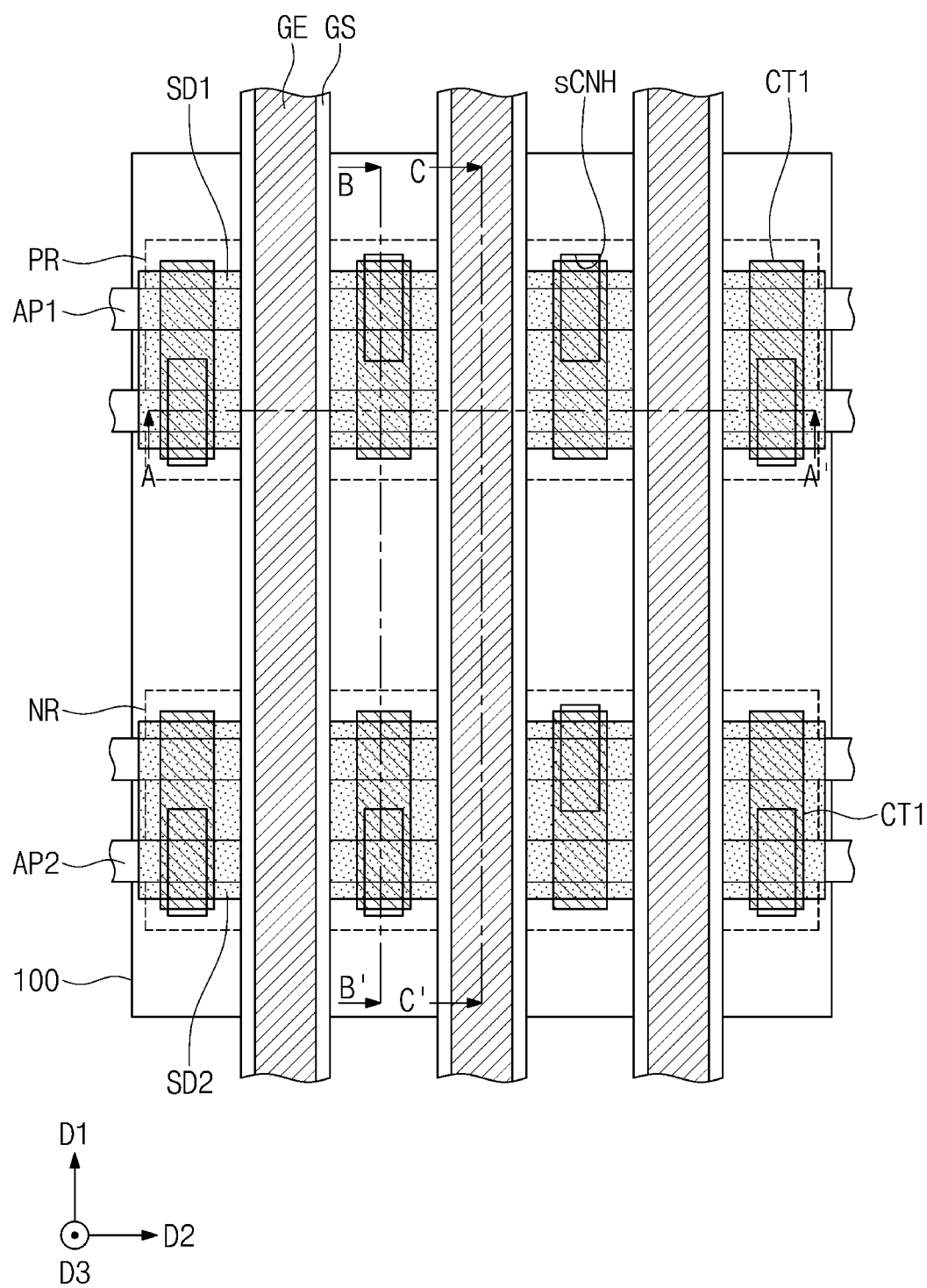
Figure 14A:
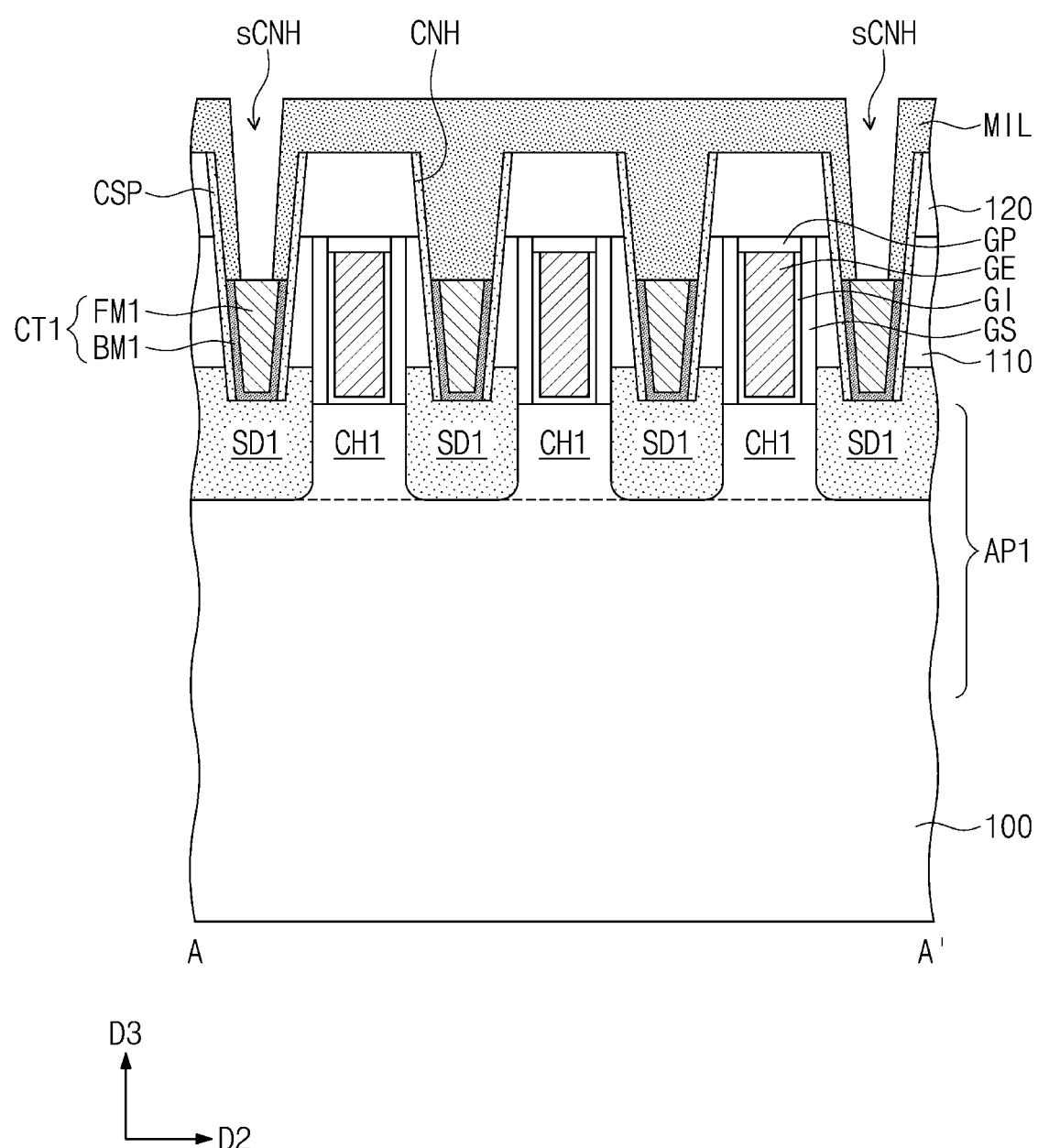
Figure 14B:
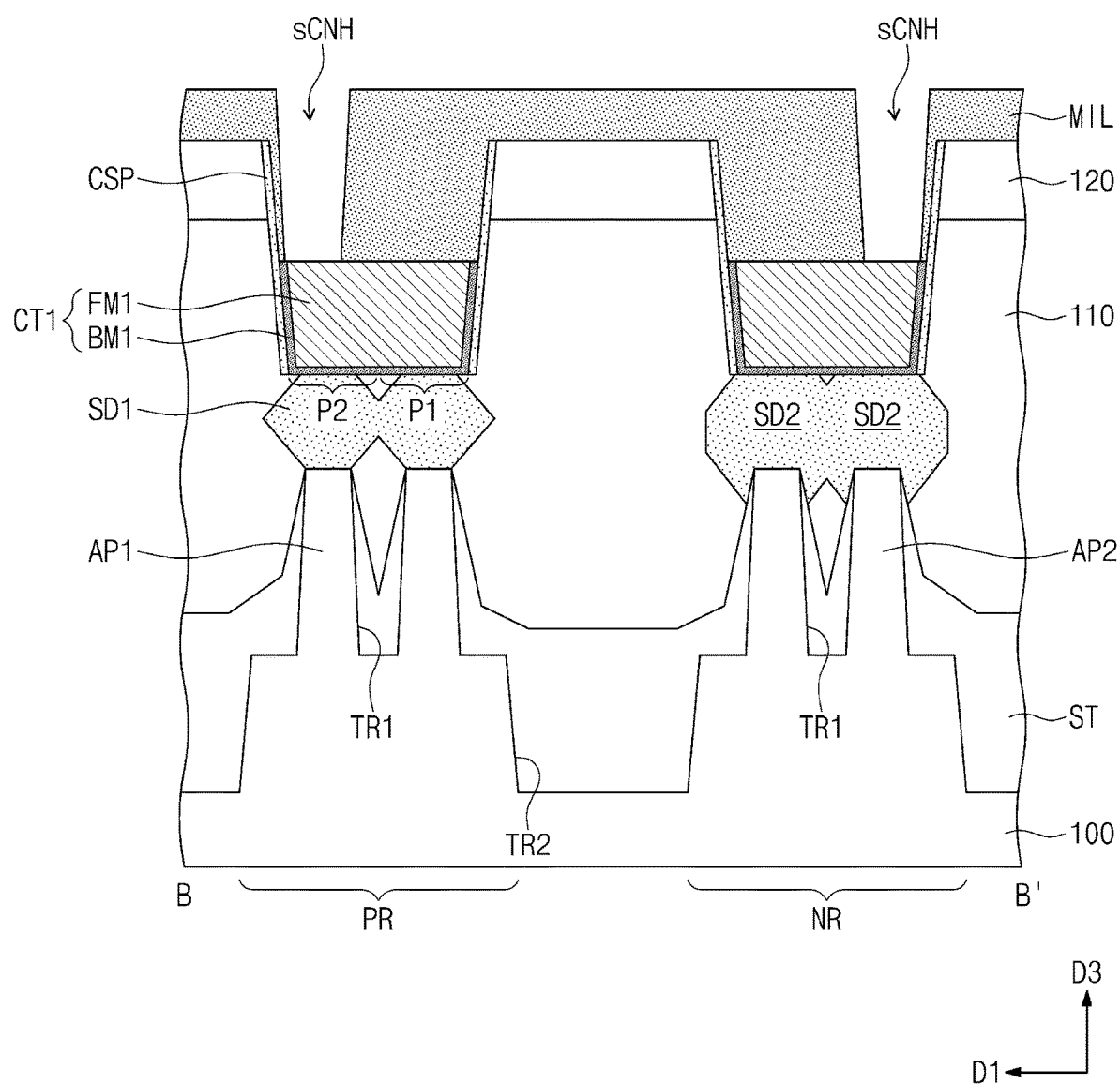
Figure 14C:
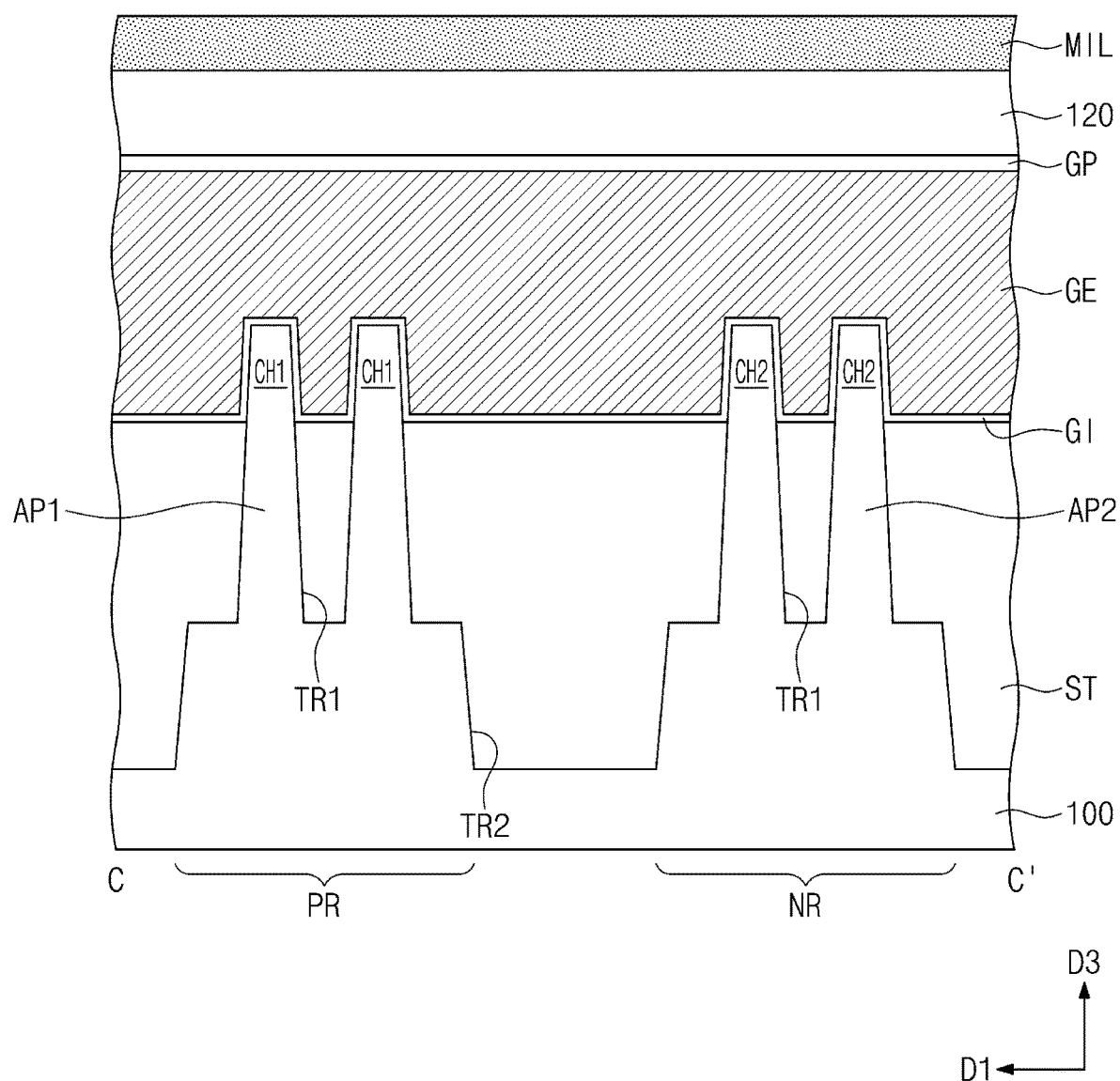
Figure 15:
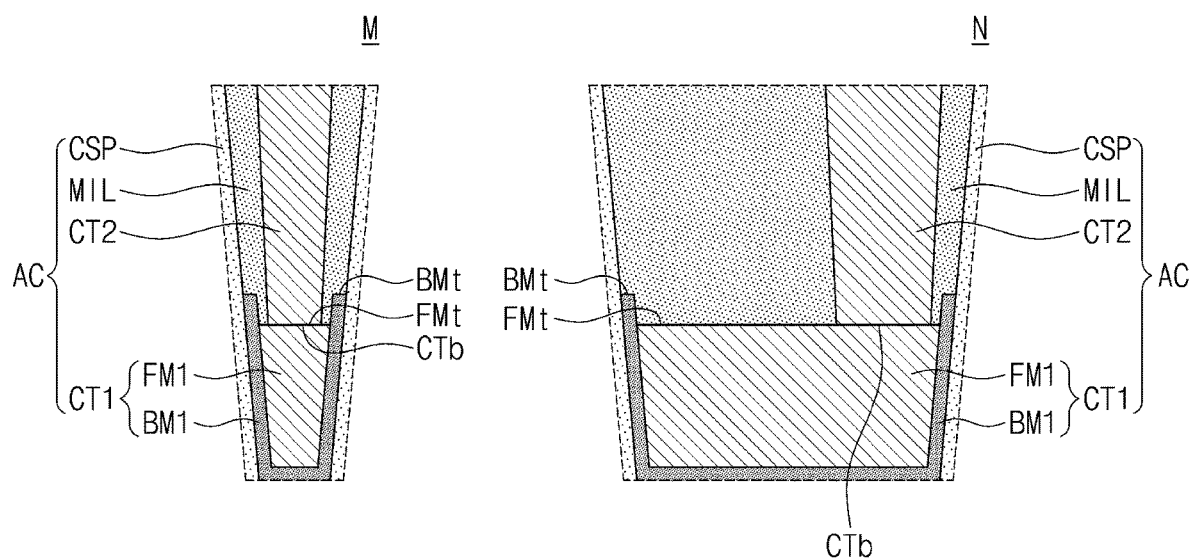
FIGS. 15 to 20 illustrate contact structures according to example embodiments and are cross-sectional views of portion M of FIG. 2A and of portion N of FIG. 2B.

Referring to FIGS. 3 and 4, an upper portion of the substrate 100 may be patterned to form the first and second active patterns AP1 and AP2. The first trench TR1 may be formed between the first active patterns AP1 and between the second active patterns AP2. The second trench TR2 may be formed between the PMOSFET region PR in which the first active patterns AP1 are formed and the NMOSFET region NR in which the second active patterns AP2 are formed.

The device isolation layer ST may be formed on the substrate 100 to fill the first and second trenches TR1 and TR2. The device isolation layer ST may include an insulation material, e.g., silicon oxide. The device isolation layer ST may be recessed until upper portions of the first and second active patterns AP1 and AP2 are exposed, such that the upper portions of the first and second active patterns AP1 and AP2 may vertically protrude above the device isolation layer ST.

Referring to FIGS. 5 and 6A to 6C, sacrificial patterns PP may be formed on the substrate 100 to traverse the first and second active patterns AP1 and AP2. The sacrificial patterns PP may be formed in a linear or bar shape extending in the first direction D1. Specifically, the formation of the sacrificial patterns PP may include forming a sacrificial layer on a whole surface of the substrate 100, forming hard mask patterns MA on the sacrificial layer, and patterning the sacrificial layer using the hard mask patterns MA as an etch mask. The sacrificial layer may include a polysilicon layer.

A pair of gate spacers GS may be formed on opposite sidewalls of each of the sacrificial patterns PP. The gate spacers GS may be formed on opposite sidewalls of each of the first and second active patterns AP1 and AP2. The sidewalls of the first and second active patterns AP covered by the gate spacers GS may be surfaces that are not covered by the device isolation layer ST and the sacrificial patterns PP.

The formation of the gate spacers GS may include conformally forming a gate spacer layer on the whole surface of the substrate 100 and anisotropically etching the gate spacer layer. The gate spacer layer may include ate least one of SiCN, SiCON, and SiN. In some embodiments, the gate spacer layer may be a multi-layer film including at least two of SiCN, SiCON, and SiN.

Referring to FIGS. 7 and 9A to 9C, the first source/drain regions SD1 may be formed on each of the first active patterns AP. A pair of first source/drain regions SD1 may be formed at opposite sides of each of the sacrificial patterns PP.

Specifically, upper portions of the first active patterns AP1 may be etched using the hard mask patterns MA and the gate spacers GS as an etch mask to form first recess regions. The gate spacers GS on the sidewalls of each of the first active patterns AP1 may also be removed during the etching of the upper portions of the first active patterns AP1. In addition, during the etching of the upper portions of the first active patterns AP1, the device isolation layer ST between the first active patterns AP1 may be recessed.

A selective epitaxial growth process may be performed using inner surfaces of the first recess regions of the first active patterns AP1 as a seed to form the first source/drain regions SD1. As the first source/drain regions SD1 are formed, the first channel region CH1 may be interposed between a pair of first source/drain regions SD1. The selective epitaxial growth process may include a chemical vapor deposition (CVD) process or a molecular beam epitaxy (MBE) process. The first source/drain regions SD1 may include a semiconductor element (e.g., SiGe) having a lattice constant larger than that of a semiconductor element of the substrate 100. Each of the first source/drain regions SD1 may be formed of multiple semiconductor layers.

In some embodiments, impurities may be injected in-situ during the selective epitaxial growth process for forming the first source/drain regions SD1. In some embodiments, after the first source/drain regions SD1 are formed, impurities may be injected into the first source/drain regions SD1. The first source/drain regions SD1 may be doped with impurities of a first conductivity type (e.g., a p-type).

The second source/drain regions SD2 may be formed on each of the second active patterns AP2. A pair of second source/drain regions SD2 may be formed at opposite sides of each of the sacrificial patterns PP.

Specifically, upper portions of the second active patterns AP2 may be etched using the hard mask patterns MA and the gate spacers GS as an etch mask to form second recess regions. A selective epitaxial growth process may be performed using inner surfaces of the second recess regions of the second active patterns AP2 as a seed to form the second source/drain regions SD2. As the second source/drain regions SD2 are formed, the second channel region CH2 may be interposed between a pair of second source/drain regions SD2. The second source/drain regions SD2 may include the same semiconductor element (e.g., Si) as the substrate 100. The second source/drain regions SD2 may be doped with the impurities of a second conductivity type (e.g., an n-type).

The first source/drain regions SD1 and the second source/drain regions SD2 may be sequentially formed through different processes. In other words, the first source/drain regions SD1 and the second source/drain regions SD2 may not be formed at the same time.

Referring to FIGS. 9 and 10A to 10C, the first interlayer insulation layer 110 may be formed to cover the first and second source/drain regions SD1 and SD2, the hard mask patterns MA, and the gate spacers GS. The first interlayer insulation layer 110 may include, e.g., silicon oxide.

The first interlayer insulation layer 110 may be planarized to expose upper surfaces of the sacrificial patterns PP. The planarization of the first interlayer insulation layer 110 may be performed by an etch back process or a chemical mechanical polishing (CMP) process. The hard mask patterns MA may be completely removed during the planarization process. Thus, an upper surface of the first interlayer insulation layer 110 may be coplanar with the upper surfaces of the sacrificial patterns PP and upper surfaces of the gate spacers GS.

The sacrificial patterns PP may be replaced with the gate electrodes GE. Specifically, the exposed sacrificial patterns PP may be selectively removed. As the sacrificial patterns PP are removed, empty spaces may be formed. The gate dielectric pattern GI, the gate electrode GE, and the gate capping pattern GP may be formed in each of the empty spaces. The gate dielectric pattern GI may be conformally formed not to completely fill each of the empty spaces. The gate dielectric pattern GI may be formed by an atomic layer deposition (ALD) process or a chemical vapor deposition (CVD) process. The gate dielectric pattern GI may include, e.g., a high-k dielectric material.

The gate electrode GE may be formed by forming a gate electrode layer to completely fill each of the empty spaces and then planarizing the gate electrode layer. The gate electrode layer may include, e.g., metal nitride and/or metal.

Thereafter, an upper portion of the gate electrode GE may be recessed. The gate capping pattern GP may be formed on the recessed gate electrode GE. The gate capping pattern GP may include at least one of SiON, SiCN, SiCON, and SiN.

Referring to FIGS. 11 and 12A to 12C, the second interlayer insulation layer 120 may be formed on the first interlayer insulation layer 110. The second interlayer insulation layer 120 may include, e.g., a silicon oxide layer or a low-k oxide layer. The low-k oxide layer may include carbon-doped silicon oxide, such as SiCOH. The second interlayer insulation layer 120 may be formed by a chemical vapor deposition (CVD) process.

The contact hole CNH may be formed to pass through the second interlayer insulation layer 120 and the first interlayer insulation layer 110 to expose the first source/drain region SD1 and/or the second source/drain region SD2. The contact spacer CSP may be formed to cover an inner sidewall of the contact hole CNH. The contact spacer CSP may be formed by conformally forming a contact spacer layer to cover the inner sidewall of the contact hole CNH and aniostropically etching the contact spacer layer. The contact spacer layer may include at least one of SiCN, SiCON, and SiN.

The first contact CT1 may be formed to fill a lower portion of the contact hole CNH. The first contact CT1 may contact the first and second source/drain regions SD1 and SD2. The formation of the first contact CT1 may include forming the first barrier pattern BM1 and the first conductive pattern FM1. Specifically, a first barrier layer formed to fill the contact hole CNH, and then a first conductive layer may be formed on the first barrier layer. The first barrier layer and the first conductive layer may be recessed to form the first barrier pattern BM1 and the first conductive pattern FM1, respectively. The first barrier layer may include metal nitride. The first conductive pattern may include metal.

Referring to FIGS. 13 and 14A to 14C, the insulation layer MIL may be formed on the substrate 100. The insulation layer MIL may fill the contact hole CNH. The insulation layer MIL may cover a top of the contact hole CNH. The insulation layer MIL may include silicon oxide or silicon nitride.

The insulation layer MIL may be patterned to form a sub-contact hole sCNH in the contact hole CNH. The sub-contact hole sCNH may expose an upper surface of the first contact CT1. The sub-contact hole sCNH may expose the first portion P1 or the second portion P2 of the first contact CT1.

Referring again to FIGS. 1 and 2A to 2C, the second contact CT2 may be formed to fill the sub-contact hole sCNH. A planarization process may be performed to expose an upper surface of the second interlayer insulation layer 120. Accordingly, the contact structure AC including the first contact CT1 and the second contact CT2 may be formed.

The gate contacts GC may be formed to pass through the second interlayer insulation layer 120 and the first interlayer insulation layer 110 to be electrically connected to the gate electrodes GE, respectively. The formation of the gate contacts GC may be similar to the formation of the first contact CT1. For example, the formation of each of the gate contacts GC may include forming a contact hole to pass through the second interlayer insulation layer 120 and the first interlayer insulation layer 110 to expose an upper surface of each of the gate electrodes GE, forming the contact spacer CSP on an inner sidewall of the contact hole, and forming the second barrier pattern BM2 and the second conductive pattern FM2. In some embodiments, the gate contacts GC may be formed along with the first contact CT1. In some embodiments, the gate contacts GC may be formed by a process separate from the contact structures AC.

The third interlayer insulation layer 130 may be formed on the second interlayer insulation layer 120. The wiring lines MI may be formed in the third interlayer insulation layer 130 to be electrically connected to the contact structures AC and the gate contact GC.

FIGS. 15 to 20 illustrate respectively a contact structure according to example embodiments and are cross-sectional views of portion M of FIG. 2A and of portion N of FIG. 2B. Detailed description of technical features overlapping with the semiconductor device described above with reference to FIGS. 1 and 2A through 2C will be omitted, and differences will be described in more detail Referring to FIG. 15, an upper surface FMt of the first conductive pattern FM1 may be lower than an upper surface BMt of the first barrier pattern BM1, with respect to the upper surface of the substrate 100. A lower surface CTb of the second contact CT2 may be lower than the upper surface BMt of the first barrier pattern BM1, with respect to the upper surface of the substrate 100. In the contact structure AC according to example embodiments, the first conductive pattern FM1 may be formed by being recessed further than the first barrier pattern BM1.

Figure 16:
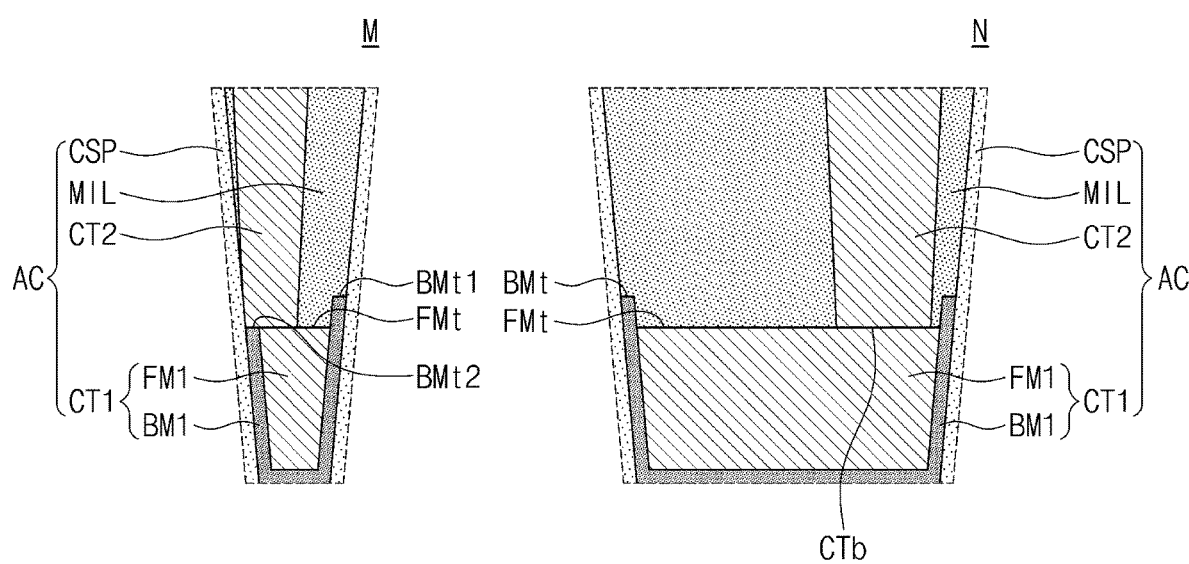

Referring to FIG. 16, the second contact CT2 may be offset from a center line of the first contact CT1 extending through an axial center of the first contact CT1. The first barrier pattern BM1 may have a first upper surface BMt1 at a first side thereof. The first barrier pattern BM1 may have a second upper surface BMt2 at a second side thereof opposite to the first side thereof. The second upper surface BMt2 of the first barrier pattern BM1 may contact the second contact CT2. The second surface BMt2 of the first barrier pattern BM1 may be lower than the first surface BMt1 thereof, with respect to the upper surface of the substrate 100.

Figure 17:
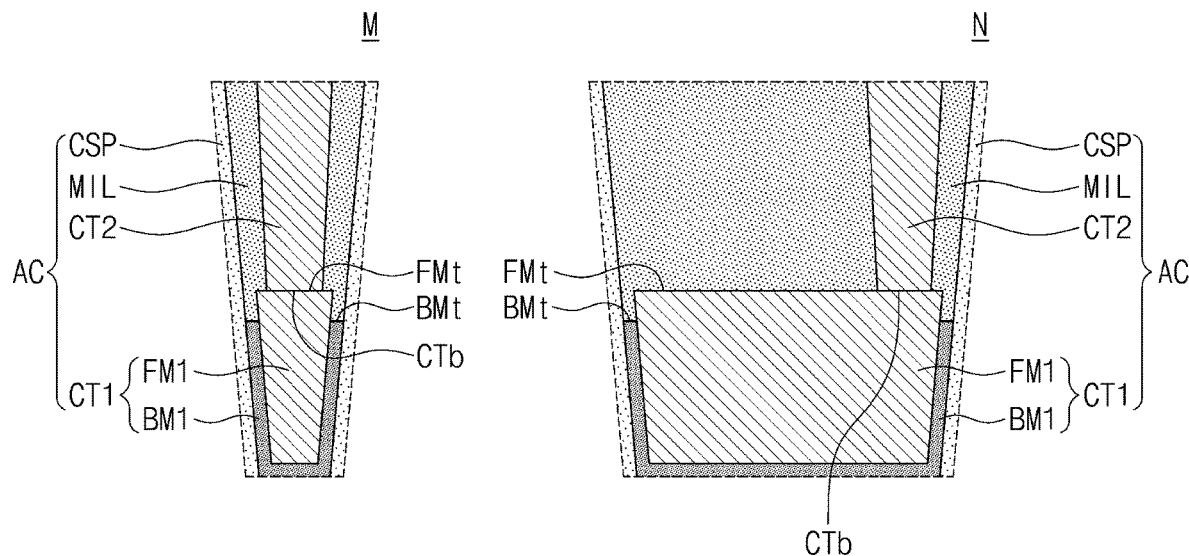

Referring to FIG. 17, the upper surface FMt of the first conductive pattern FM1 may be higher than the upper surface BMt of the first barrier pattern BM1, with respect to the upper surface of the substrate 100. The lower surface CTb of the second contact CT2 may be higher than the upper surface BMt of the first barrier pattern BM1, with respect to the upper surface of the substrate 100. An upper sidewall of the first conductive pattern FM1 positioned higher than the upper surface BMt of the first barrier pattern BM1 may be covered by the insulation layer MIL. In the contact structure AC according to example embodiments, the first barrier pattern BM1 may be formed by being recessed further than the first conductive pattern FM1.

Figure 18:
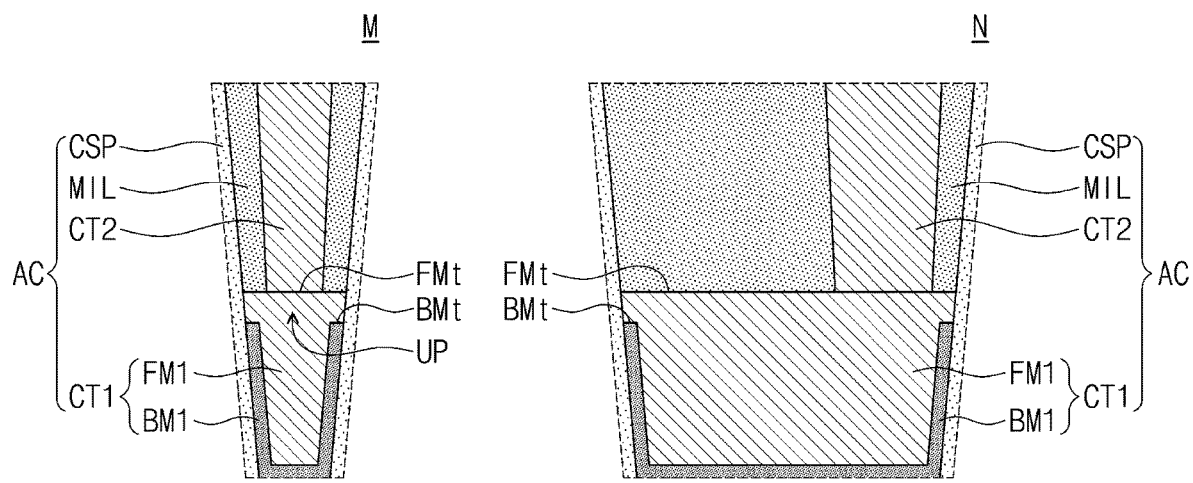

Referring to FIG. 18, the upper surface FMt of the first conductive pattern FM1 may be higher than the upper surface BMt of the first barrier pattern BM1, with respect to the upper surface of substrate 100. An upper portion UP of the first conductive pattern FM1 may cover the upper surface BMt of the first barrier pattern BM1. In other words, a cross-section of the first conductive pattern FM1 may have a T shape. The formation of the contact structure AC according to example embodiments may include forming the first barrier pattern BM1, forming the first conductive layer on the first barrier pattern BM1, and recessing the first conductive layer not to expose the first barrier pattern BM1 to form the first conductive pattern FM1.

Figure 19:
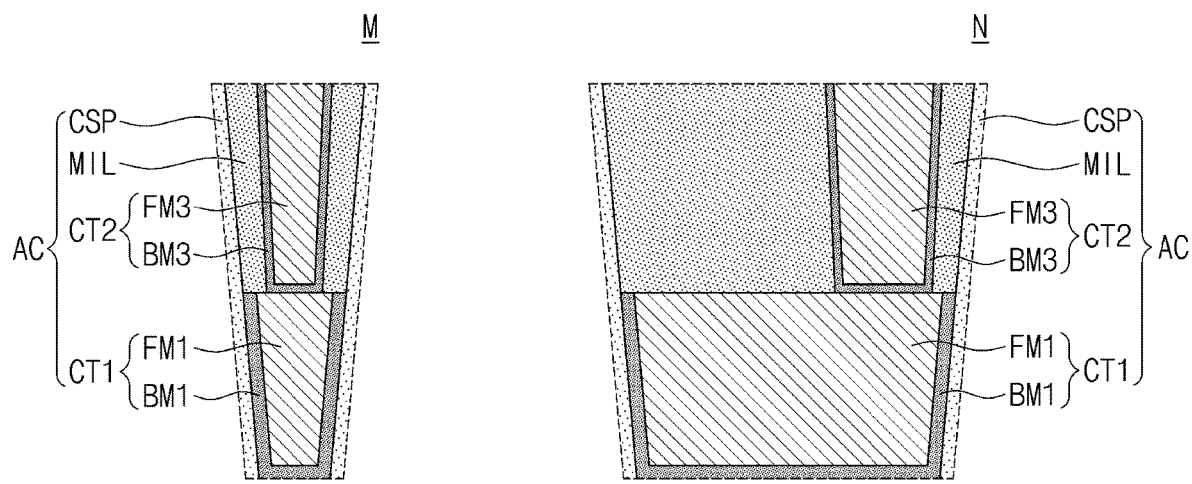

Referring to FIG. 19, the second contact CT2 may include a third barrier pattern BM3 and a third conductive pattern FM3. The third barrier pattern BM3 may be interposed between the third conductive pattern FM3 and the insulation layer MIL and between the third conductive pattern FM3 and the first contact CT1. The third barrier pattern BM3 may cover opposite sidewalls and a lower surface of the third conductive pattern FM3. The third barrier pattern BM3 may include metal nitride. The third conductive pattern FM3 may include metal.

Figure 20:
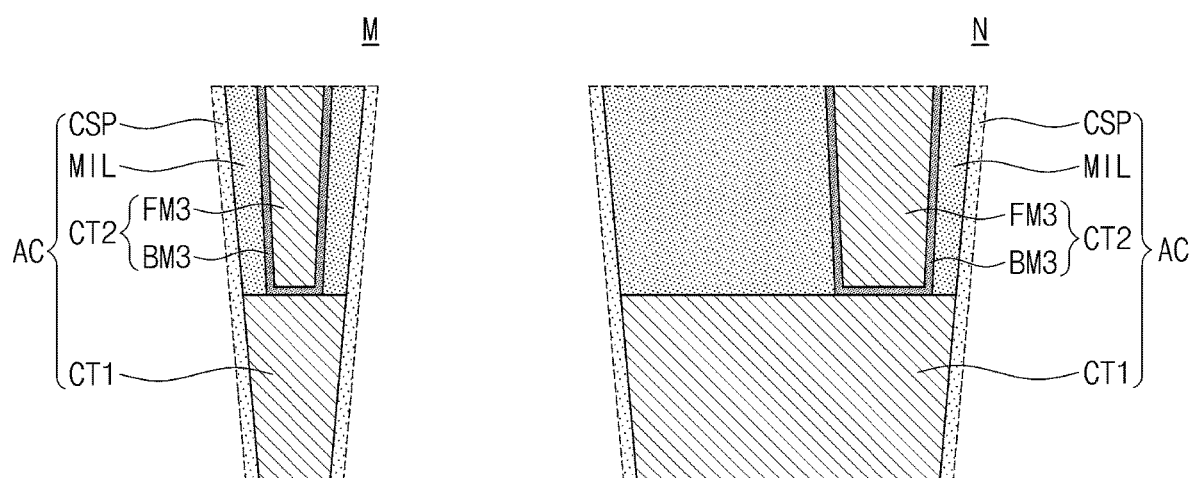

Referring to FIG. 20. the first barrier pattern BM1 in the first contact CT1 may be omitted. For example, the first contact CT1 may be formed of a single metal material. The second contact CT2 may include the third barrier pattern BM3 and the third conductive pattern FM3.

While the present inventive concepts have been shown and described with reference to example embodiments thereof, it will be understood by those of ordinary skill in the art that various changes in form and details may be made thereto without departing from the spirit and scope of the present inventive concepts as set forth by the following claims.

What is claimed is:

1. A semiconductor device comprising: a substrate including an active region; an active pattern on the active region of the substrate, the active pattern including a first channel pattern and a first source/drain pattern connected to the first channel pattern; a first gate electrode on the first channel pattern; a first contact structure on the first source/drain pattern and electrically connected to the first source/drain pattern; and a gate contact on the first gate electrode and electrically connected to the first gate electrode, wherein the first contact structure includes: a first lower contact electrically connected to the first source/drain pattern; and an upper insulation layer on the first lower contact, wherein the gate contact vertically overlaps the first channel pattern, wherein the upper insulation layer is adjacent to the gate contact, wherein a top surface of the first lower contact is lower than a bottom surface of the gate contact, and wherein the active pattern comprises vertically protruding portions.

2. The semiconductor device of claim 1, wherein the upper insulation layer covers the top surface of the first lower contact.

3. The semiconductor device of claim 1, further comprising:
a first via on the gate contact; and
a first wiring line electrically connected to the gate contact through the first via.

4. The semiconductor device of claim 1, wherein the active pattern further includes a second channel pattern and a second source/drain pattern connected to the second channel pattern,
wherein the semiconductor device further comprises:
a second gate electrode on the second channel pattern; and
a second contact structure on the second source/drain pattern and electrically connected to the second source/drain pattern,
wherein the second contact structure includes:
a second lower contact that is electrically connected to the second source/drain pattern; and
an upper contact on a top surface of the second lower contact, and
wherein the upper contact vertically overlaps the second source/drain pattern.

5. The semiconductor device of claim 4, further comprising:
a second via on the upper contact; and
a second wiring line electrically connected to the second contact structure through the second via.

6. The semiconductor device of claim 4, wherein a width of the upper contact is less than a width of the second lower contact.

7. The semiconductor device of claim 1, wherein the first lower contact is spaced part from the gate contact by the upper insulation layer.

8. The semiconductor device of claim 1, wherein the first contact structure further includes a contact spacer on a sidewall of the first lower contact and a sidewall of the upper insulation layer.

9. The semiconductor device of claim 1, wherein the first contact structure further includes a contact spacer on a sidewall of the first lower contact and a sidewall of the upper insulation layer.

10. The semiconductor device of claim 1, wherein the top surface of the first lower contact is lower than a top surface of the first gate electrode.

11. A semiconductor device comprising: a substrate; a first active pattern on the substrate; a second active pattern on the substrate; a device isolation layer on the substrate, the device isolation layer being between the first active pattern and the second active pattern; a first source/drain pattern on the first active pattern; a second source/drain on the second active pattern; and a contact structure on at least one of the first and second source/drain patterns, wherein the contact structure includes: a lower contact electrically connected to the at least one of the first and second source/drain patterns; an upper contact on the lower contact; and an upper insulation layer on the lower contact, wherein the upper insulation layer covers a sidewall of the upper contact, wherein the lower contact includes a conductive pattern and a barrier pattern on side and bottom surfaces of the conductive pattern, wherein a top surface of the conductive pattern is at a different level than a top surface of the barrier pattern, wherein the upper insulation layer covers the top surface of the conductive pattern and the top surface of the barrier pattern, wherein at least one of the first active pattern and the second active pattern comprises vertically protruding portions.

12. The semiconductor device of claim 11, wherein a width of the upper contact is less than a width of the lower contact.

13. The semiconductor device of claim 11, wherein the top surface of the conductive pattern is higher than the top surface of the barrier pattern.

14. The semiconductor device of claim 11, wherein the top surface of the conductive pattern is lower than the top surface of the barrier pattern.

15. The semiconductor device of claim 11, wherein the upper contact contains the same material as the conductive pattern.

16. A semiconductor device comprising: a substrate; a first active pattern on the substrate; a second active pattern on the substrate; a device isolation layer on the substrate, the device isolation layer being between the first active pattern and the second active pattern; a first source/drain pattern on the first active pattern; a second source/drain on the second active pattern; and a contact structure on at least one of the first and second source/drain patterns, wherein the contact structure includes: a lower conductive portion electrically connected to the at least one of the first and second source/drain patterns; an upper conductive portion vertically extends from the lower conductive portion; an upper insulation layer fills a recess between the lower conductive portion and an upper conductive portion; and a contact spacer on a sidewall of the lower conductive portion and a sidewall of the upper insulation layer, wherein at least one of the first active pattern and the second active pattern comprises vertically protruding portions.

17. The semiconductor device of claim 16, wherein the lower conductive portion includes a conductive pattern and a barrier pattern on side and bottom surfaces of the conductive pattern, wherein a top surface of the conductive pattern is at a different level than a top surface of the barrier pattern, and wherein the upper insulation layer covers the top surface of the conductive pattern and the top surface of the barrier pattern.

18. The semiconductor device of claim 16, wherein the upper conductive portion contains the same metal as the lower conductive portion.

19. The semiconductor device of claim 16, wherein a width of the upper conductive portion is less than a width of the lower conductive portion.

20. The semiconductor device of claim 16, further comprising:

a via on a top surface of the upper conductive portion; and
a wiring line electrically connected to the contact structure through the via.

* * * * *